US012747981B2

(12) United States Patent
Paik et al.

(10) Patent No.: US 12,747,981 B2
(45) Date of Patent: Sep. 29, 2026

(54) LASER DETECTION USING MULTIPLE IMAGE SENSORS

(71) Applicant: SRI International, Menlo Park, CA (US)

(72) Inventors: Namwoong Paik, Lawrenceville, NJ (US); Peter A. Levine, West Windsor, NJ (US); John D. Bazzano, Perkasie, PA (US)

(73) Assignee: SRI International, Menlo Park, CA (US)

( * ) Notice: Subject to any disclaimer, the term of this patent is extended or adjusted under 35 U.S.C. 154(b) by 87 days.

(21) Appl. No.: 18/984,304

(22) Filed: Dec. 17, 2024

(65) Prior Publication Data

US 2025/0198835 A1 Jun. 19, 2025

Related U.S. Application Data

(63) Continuation-in-part of application No. 18/801,131, filed on Aug. 12, 2024.

(60) Provisional application No. 63/621,901, filed on Jan. 17, 2024, provisional application No. 63/534,060, filed on Aug. 22, 2023.

(51) Int. Cl.

| | |
|---|---|
| ***G01J 1/42*** | (2006.01) |
| ***G01J 1/04*** | (2006.01) |
| ***G01J 1/44*** | (2006.01) |
| ***H10F 39/00*** | (2025.01) |

(52) U.S. Cl.
CPC ........... *G01J 1/4257* (2013.01); *G01J 1/0411* (2013.01); *G01J 1/0488* (2013.01); *G01J 1/44* (2013.01); *H10F 39/805* (2025.01); *H10F 39/806* (2025.01)

(58) Field of Classification Search
CPC ...... G01J 1/58; G01J 2001/4238; H10F 77/45
See application file for complete search history.

(56) References Cited

U.S. PATENT DOCUMENTS

2014/0049772 A1* 2/2014 Zollars .................. H10F 39/806 356/138

* cited by examiner

*Primary Examiner* — Thanh Luu
(74) *Attorney, Agent, or Firm* — Rutan and Tucker, LLP

(57) ABSTRACT

A silicon-based image sensor has an upconversion layer of crystals. The silicon-based image sensor receives light from a common beam splitter with a second image sensor. An optical band pass filter cooperates with the common beam splitter to pass some of the light to be incident on the upconversion layer of crystals in a second range of wavelengths, which will be absorbed and converted by the upconversion layer of crystals into a third range of wavelengths, and then the third range of wavelengths is transmitted onto the pixels in the silicon-based image sensor. A pulse repetition frequency decoder cooperates with the upconversion layer of crystals to decode a pulse repetition frequency of a laser flash in the second range of wavelengths passed by the optical band pass filter and subsequently upconverted by the upconversion layer of crystals and then captured by the pixels of the silicon-based image sensor.

20 Claims, 11 Drawing Sheets

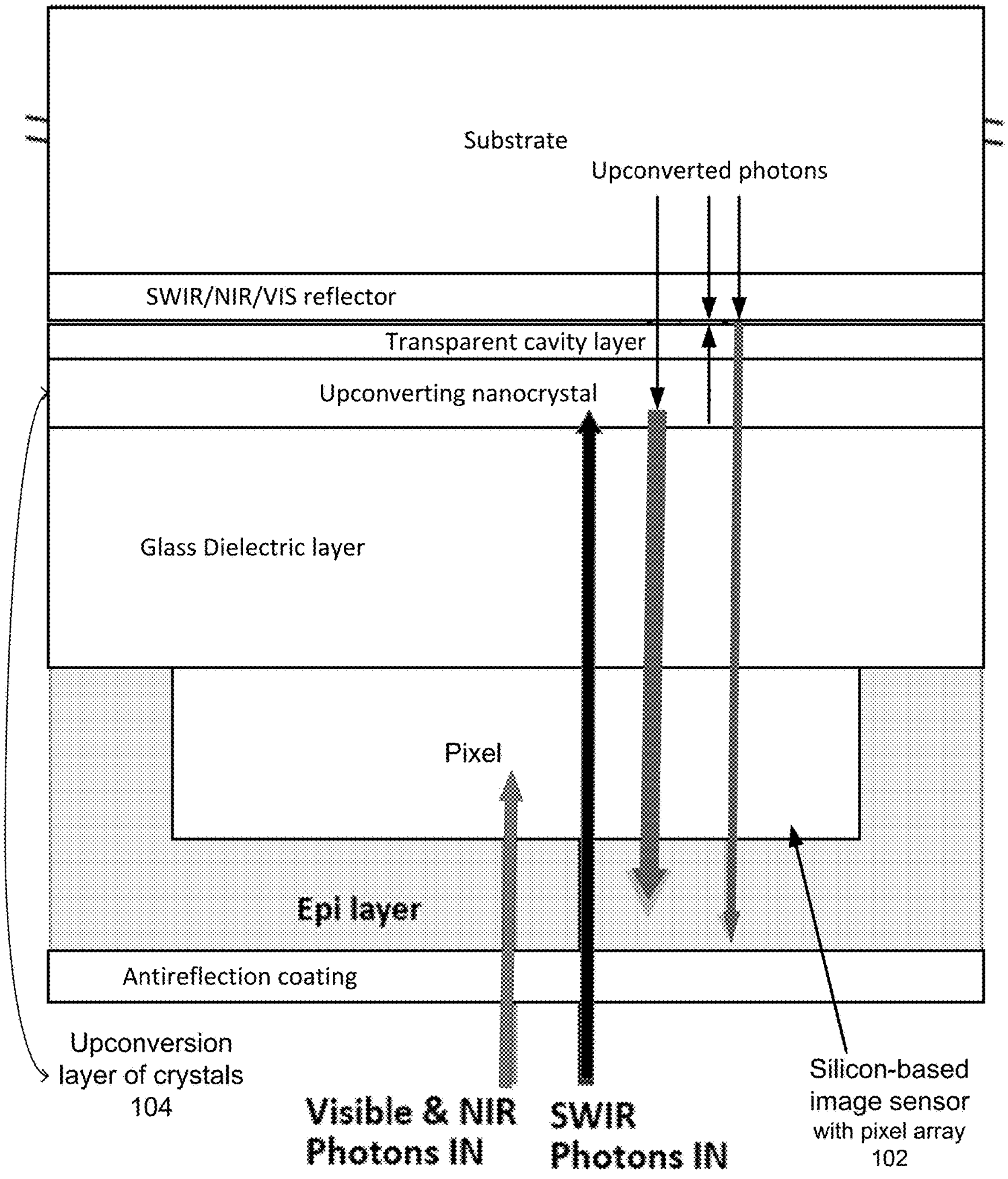
Back side upconversion layer cross section Fig. 3A

PULSE REPETITION FREQUENCY decoder on chip

Upconversion emission decay and camera output signal using known frame rate and the decay time of the upconverting emission.

LASER DETECTION USING MULTIPLE IMAGE SENSORS

RELATED APPLICATIONS

This application claims priority to and the benefit of under 35 USC 119 of U.S. provisional patent application No. 63/621,901 entitled "TWO IMAGER CAMERA OPTIMIZED SWIR AND VISNIR RESPONSE" Filed: Jan. 17, 2024. This application claims priority to and the benefit as a continuation in part patent application under 35 USC 120 of U.S. patent application Ser. No. 18/801,131 filed Aug. 12, 2024, entitled "MEASUREMENT OF A LASER PULSE REPETITION FREQUENCY USING UPCONVERSION, which claims priority under 35 USC 119 of U.S. provisional patent application No. Ser. No. 63/534,060, titled "Measurement of SWIR laser pulse repetition frequency using SWIR upconversion," filed Aug. 22, 2023, all of which are incorporated herein in their entirety by reference.

FIELD

Embodiments generally relate to an image sensor.

BACKGROUND

An imaging system can use upconversion as described in U.S. Patent Application Publication No. 2023-0041955.

SUMMARY

Provided herein are some embodiments of apparatus and methods associated with an image sensor. In an embodiment, In an embodiment, a first silicon-based image sensor has i) a pixel array with one or more pixels and ii) an upconversion layer of crystals on the first silicon-based image sensor. The first silicon-based image sensor can receive light from a common beam splitter with a second image sensor. The pixels in the second image sensor can receive light in an image frame from the common beam splitter in a first range of wavelengths onto the second image sensor. The optical band pass filter can be in an optical path of and cooperate with the common beam splitter to pass some of the light to be incident on the upconversion layer of crystals in a second range of wavelengths, which will be absorbed and converted by the upconversion layer of crystals into a third range of wavelengths, and then the light in the third range of wavelengths is transmitted onto the one or more pixels in the first silicon-based image sensor. a pulse repetition frequency decoder cooperates with the upconversion layer of crystals to decode a pulse repetition frequency of a laser flash in the second range of wavelengths passed by the optical band pass filter and subsequently upconverted by the upconversion layer of crystals into the third range of wavelengths and then captured by the one or more pixels of the first silicon-based image sensor.

In an embodiment, a first silicon-based image sensor has i) a pixel array with one or more pixels and ii) an upconversion layer of crystals on the first silicon-based image sensor. The first silicon-based image sensor can receive light from a common beam splitter with a second image sensor. The pixels in the second image sensor can receive light in an image frame from the common beam splitter in a first range of wavelengths onto the second image sensor. A dichromatic coating on the common beam splitter can pass some of the light in the image frame to be incident on the upconversion layer of crystals in a second range of wavelengths, which will be absorbed and converted by the upconversion layer of crystals into a third range of wavelengths, which is different than the first and second range of wavelengths, and then the light in the third range of wavelengths is transmitted to the one or more pixels in the first silicon-based image sensor. The pulse repetition frequency decoder can cooperate with the upconversion layer of crystals to decode a pulse repetition frequency of a laser flash in the second range of wavelengths passed by the dichromatic coating on the common beam splitter and subsequently upconverted and then captured by one or more pixels of the first silicon-based image sensor.

These and other features of the design provided herein can be better understood with reference to the drawings, description, and claims, all of which form the disclosure of this patent application.

BRIEF DESCRIPTION OF THE DRAWINGS

The drawing refers to example embodiments of the design.

FIG. 3*a* illustrates a block diagram of an embodiment of an example silicon-based image sensor that has i) a pixel array with one or more pixels and ii) an upconversion layer of crystals on the backside of the silicon-based image sensor.

Figure 1:
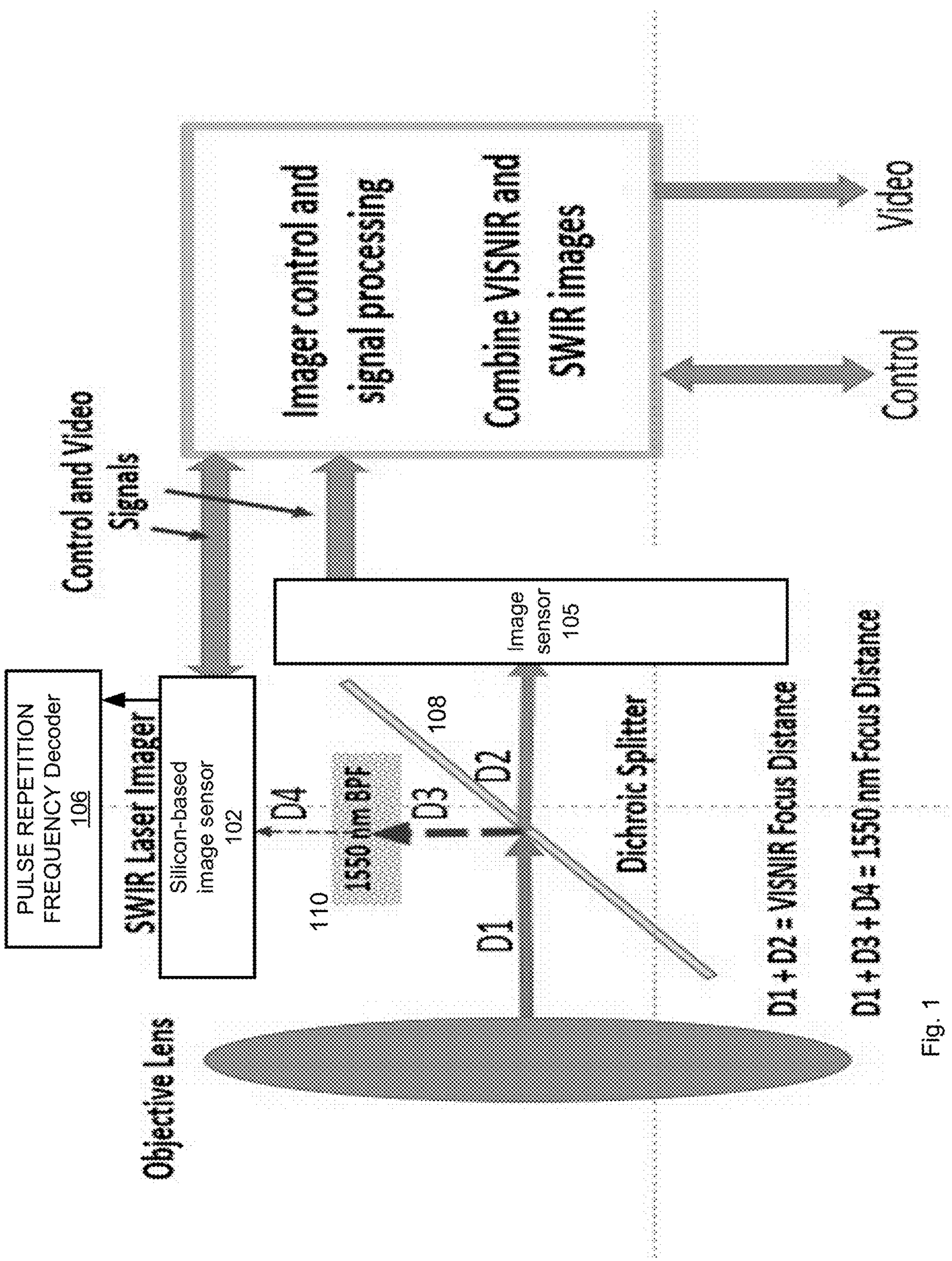
FIG. 1 illustrates a block diagram of an embodiment of an example laser detection system that can use multiple image sensors that operate in the visible/near IR spectrum ("VISNIR") and the Short-Wave IR spectrum ("SWIR").

While the design is subject to various modifications and alternative forms, specific embodiments thereof have been shown by way of example in the drawings and will herein be described in detail. The design should be understood to not be limited to the particular forms disclosed, but on the contrary, the intention is to cover all modifications, equivalents, and alternatives falling within the spirit and scope of the design.

DETAILED DISCUSSION

In the following description, numerous specific details are set forth, such as examples of specific data signals, named components, etc., in order to provide a thorough understanding of the present design. It will be apparent, however, to one of ordinary skill in the art that the present design can be practiced without these specific details. In other instances, well-known components or methods have not been described in detail but rather in a block diagram in order to avoid unnecessarily obscuring the present design. Further, specific numeric references, such as a first pixel, can be made. However, the specific numeric reference should not be interpreted as a literal sequential order but rather interpreted that the first pixel is different than a second pixel. Thus, the specific details set forth are merely exemplary. Also, the features implemented in one embodiment may be implemented in another embodiment where logically possible. The specific details can be varied from and still be contemplated to be within the spirit and scope of the present design. The term coupled is defined as meaning connected either directly to the component or indirectly to the component through another component.

FIG. 1 illustrates a block diagram of an embodiment of an example laser detection system that can use multiple image sensors that operate in the visible/near IR spectrum ("VISNIR") and the Short-Wave IR spectrum ("SWIR").

The laser detection system can include an image sensor 105 with one or more pixels (e.g. the VISNIR imager) and a silicon-based image sensor 102 that has i) a pixel array with one or more pixels and ii) an upconversion layer of crystals 104 on at least one of a front side and a backside of the silicon-based image sensor 102 (e.g. the short wave infrared imager). The pixel array with one or more pixels on the other image sensor 105 (e.g. the VISNIR imager) may be configured to detect light wavelengths in one or more of ultraviolet (UV) light, visible light, and near-infrared (NIR) light wavelengths such as 400 nm-1050 nm. The silicon-based image sensor 102 with the upconversion layer of crystals 104 can absorb all or just a portion of SWIR wavelengths.

An image capture of a scene is focused with a lens having a different focus distance for the SWIR and VISNIR wavelengths due to a refractive index change with the wavelengths. The common dichroic beam splitter 108 passes VISNIR light to the other image sensor 105 (e.g. the VISNIR imager) and reflects light in merely the SWIR wavelengths to the silicon-based image sensor 102 with the upconversion layer of crystals 104 (e.g. the SWIR imager). The silicon-based image sensor 102 has i) the pixel array with one or more pixels and ii) the upconversion layer of crystals 104 that can receive light from the common beam splitter 108 with the other image sensor 105. The pixels in the other image sensor 105 can receive light in an image frame from the common dichroic beam splitter 108 in a first range of wavelengths, such as visible and near-infrared wavelengths (400 nm-2550 nm). Thus, the other image sensor 105 essentially captures everything in the scene and the silicon-based image sensor 102 with the upconversion layer of crystals 104 cooperating with the optical bandpass filter 110 captures a wavelength range that focuses around the desired laser pulse in the SWIR wavelengths.

The lens has a refractive index that has a different focus distance for the silicon-based image sensor 102 and the other image sensor 105 due to refractive index change with the wavelengths. VISNIR and SWIR wavelengths do not focus on the same point due to the difference in the index of refraction for glass materials for the VISNIR and SWIR wavelengths. Thus, the refractive lens has an index of refraction such that wavelengths in the first range of wavelengths of VISNIR and in the second range of wavelengths of short wave infrared wavelengths do not focus on the same focal distance (same point). The position of the other image sensor 105 (e.g. the VISNIR imager) relative to the lens is set so that the common beam splitter 108 puts the lens' orientation to the other image sensor 105 at the focal point distance of D1+D2 (set at a general focal distance to capture all wavelengths from 400 nm to 1600 nm in focus). The position of the silicon-based image sensor 102 with the upconversion layer of crystals 104 to the lens is set at a distance D1+D3+D4 (set at a specific focal distance to capture merely wavelengths from 1550 nm+−25 nm in focus) through the common beam splitter 108 and the narrow band pass filter 110. Thus, the silicon-based image sensor 102 is set at a focal distance point for the short wave infrared wavelengths 1550 nm+−25 nm; whereas, the other image sensor 105 must have a focal distance at an average medium focal distance/length that best suits all wavelengths from 400 nm to 1600 nm in order to capture all of the objects in the image.

Again, the silicon-based image sensor 102 (e.g. the short wave infrared imager) and the other image sensor 105 (e.g. the VISNIR imager) are aligned relative to the common beam splitter 108 and the lens. The orientation of the lens relative to the two image sensors 102 and 105 should give each image sensor the same field of view. Thus, the position of the silicon-based image sensor 102 with the upconversion layer of crystals 104 for SWIR wavelengths and the image sensor 102 for VISNIR wavelengths is set so distance D1+D2 puts the VISNIR image at the focal point and the SWIR imager distance D1+D3+D4 puts the SWIR image in focus. Thus, a first focal distance for the pixels in the other image sensor 105 is configured to receive light in the image frame from the common dichroic beam splitter 108 in the first range of wavelengths of, for example, 400 nm to 1050 nm. The second focal distance for the pixels in the silicon-based image sensor 102 is configured to receive light in the image frame from the common dichroic beam splitter 108 in the second range of wavelengths of, for example, 1525 nm to 1575 nm.

The optical bandpass filter 110 is configured to be in the optical path of and cooperate with the common beam splitter 108 to pass some of the light to be incident on the upconversion layer of crystals 104 in the second range of wavelengths, such as a narrow-band within the short wave infrared wavelengths (e.g. 1550 nm+ or −25 nm). The narrow band within short wave infrared wavelengths of 1550 nm+ or −25 nm will be absorbed and converted by the upconversion layer of crystals 104 into a third range of wavelengths (e.g. 930 to 980 nm). Next, the light in the third range of wavelengths is transmitted onto and absorbed by one or more pixels in the silicon-based image sensor. The narrow-band optical bandpass filter 110 around the SWIR laser wavelength virtually eliminates all background signals to maintain output noise free of extraneous photon shot noise by merely passing, for example, the narrow band within the short wave infrared wavelengths of 1550 nm+ or −25 nm.

The system can use 1) variations of multiple image sensors to detect a laser as well as 2) the above-discussed narrow-bandpass optical bandpass filter 110 and/or a dichromatic coating on the common beam splitter 108 in the SWIR path to accomplish a similar filtering effect. This optical bandpass filter 110 can have its band pass range set to pass the SWIR laser wavelengths of interest but reduce all other extraneous signal and associated shot noise. This is important for spotting lasers in bright or slightly bright scenes so that the shot noise does not dominate the imager readout noise and makes it impossible to see the laser spot.

Next, the image data from the pixels in the silicon-based image sensor 102 with the upconversion layer of crystals 104 and the image data from the pixels in the other image sensor 105 is collected on a per frame basis and then fed to the image processing unit 112. The image processing unit 112 has one or more processors to execute software, software stored in a memory, and at least two separate channels. A gain adjustment for a first channel (e.g. the short wave infrared channel) for image data collected from the silicon-based image sensor 102 with the upconversion layer of crystals 104 is set to be a higher gain (e.g. at least 10× of the gain/(signal to noise ratio)) compared to a second channel for image data collected from the other image sensor 105 (e.g. the VISNIR imager), in order to make the captured laser flash in the second range of wavelengths passed by the optical bandpass filter 110, more visible in the image frame. The image frame may capture, for example, a bright scene (e.g. full daylight and thus around 10,000 lux, meaning 10,000 lumens per square meter 10+3 lux to 10+5 lux) along with the laser pulse. The laser pulse within that bright scene is potentially captured by the image data the other image sensor 105. Merely, the laser pulse itself is captured in the image data from the silicon-based image sensor 102 with the upconversion layer of crystals 104. The image data from both image sensors 102 and 105 is combined into a single combined image output from the image processing unit 112. An individual channel optimization can be used because the focal point is different for the VISNIR and SWIR wavelengths and the image data comes from two separate image sensors. For example, the narrow-band optical bandpass filter 110 assists in significantly reducing any solar-related ambient light and radiation types outside the narrow band within the short wave infrared wavelengths of 1550 nm+ or −25 nm. Correspondingly, the imager control and signaling processing circuitry in the image processing unit 112 can also further filter wavelengths within the wavelengths of 1550 nm+ or −25 nm by looking for laser pulse characteristics before applying the higher gain such as the temporary nature of laser pulses rather than consistent ambient light waves. Thus, the imager control and signaling processing circuitry will not apply increased gain on these ambient light and radiation types that fall within the 1550+ or −25 nm range of wavelengths. For the VISNIR channel, color imaging wavelengths (e.g. 380 nm-750 nm) enhancements can be added so that again the background scene around the laser pulse is crisper and more distinguishable in the merged image so that the operator of the camera can then in the merged image detect laser pulses along with the rest of the visible objects in the scene.

In the image processing unit 112, image data from the silicon-based image sensor 102 with the upconversion layer of crystals 104 and the other image sensor 105 in which their respective VISNIR and SWIR signals are digitally combined and aligned in the camera to form a single image of the laser and its surrounding environment. However, the gain adjusted for the laser based SWIR signals makes the laser signal easily visible, even in a bright full sunny day scene. The gain on the laser based SWIR signals is limited on the higher end to ensure eye-safe covert laser imaging. Thus, the system, apparatus, and/or method discloses multiple image sensors that are used to form a high performance camera to provide eye-safe covert laser imaging that operates in the VISNIR and SWIR spectrums.

In parallel to the image processing unit 112 processing the captured image data, a pulse repetition frequency decoder cooperates with the upconversion layer of crystals 104 to decode a pulse repetition frequency of a laser flash, as discussed in more detail later.

Again, the laser detection system can have the other image sensor 105 optimized for the spread of wavelengths of VISNIR from 400 nm-2550 nm. In another embodiment, the other image sensor 105 can be optimized for the spread of color wavelengths from 380 nm-750 nm. The silicon-based image sensor 102 (e.g. SWIR band imager) can be a silicon device using upconverting crystals optimized to spot covert SWIR lasers such as an Erbium glass laser with an output at 1535 nm. The upconverting crystals and dopant selected in the silicon-based image sensor 102 can be optimized for 1535 nm excitation with emission within the optical spectrum which can be detected using a silicon imager. As discussed later, various types and densities of upconversion crystals can be used.

The silicon-based image sensor 102 can use upconverted emissions from SWIR wavelengths. In practice, electrons generated by VISNIR photons in a pixel will have a shot noise component which reduces SWIR sensitivity for that pixel. Yet, SWIR operation generally relies on having low noise such as 1 e-rms per pixel. Having a single imager do both SWIR and VISNIR in the same imager is difficult to achieve under most operational conditions. The two-imager approach uses a narrow-bandpass optical bandpass filter 110 to eliminate most VISNIR wavelengths from being directed to the silicon-based image sensor 102 with the upconversion layer of crystals 104 and merely pass the laser wavelengths, which reduces non-laser signals to a level so low as to not increase imager noise floor. All wavelengths including, these blocked VISNIR wavelengths, are imaged by the second image sensor 105.

The two-imager approach allows there to be no interaction between VISNIR and SWIR detection in the same imager but just proper merging in post collection of the image data. Each image sensor can be optimized. For example, the two image sensors do not need to have the same pixel size or number of pixels. The silicon-based image sensor 102 (e.g. SWIR imager) can have fewer pixels than a second image sensor (e.g. VISNIR imager) to allow a higher frame for extraction of PRF code for laser detection.

In prior techniques, the system attempted to capture the laser pulse along with all of the other objects and wavelengths in the captured image in a single image sensor. In an embodiment, discussed herein, the silicon-based image sensor 102 (e.g. the short wave infrared imager) is hyper focused on capturing merely the wavelengths corresponding to the laser(s) of interest with wavelengths in the band of the second range of wavelengths and filtering out all of the other objects and wavelengths not in the desired laser wavelength band with use of the optical band pass filter 110, the dichromatic coating on the common beam splitter 108, and/or the density of the coating of the plurality of crystals in the upconversion layer 104. Once the laser pulse is captured by the silicon-based image sensor 102 (e.g. its dedicated short wave infrared imager), and then the image processing unit 112 can use signal processing circuitry and software to emphasize the captured laser pulse through i) gain amplification and/or ii) electronic filtering of wavelengths in the same range of wavelengths as the laser pulse (e.g. the second range of wavelengths, such as a narrow band within short wave infrared wavelengths of 1550 nm+ or −25 nm) but do not share the same characteristics as the temporary pulse nature of a laser pulse, compared to all of the rest of objects and wavelengths captured in the overall image capture for that frame, and then merge the image data from the two imagers so that any laser pulse is captured and stands out amongst the rest of the objects and wavelengths in the captured image.

Laser detection using multiple image sensors is practical to sense the laser in a wide range of lighting conditions from a moonless night to a bright sunny afternoon/daytime because the high VISNIR light levels that also cause shot noise are dealt with by the second image sensor but the first silicon-based image sensor 102 with the upconversion layer of crystals 104 is not exposed to those high VISNIR light levels. The silicon-based image sensor 102 with the optical bandpass filter 110 prevents the upconverted SWIR signal from the laser pulse being buried during the day in the noise present in the silicon-based image sensor 102 because the silicon-based image sensor 102 with the upconversion layer of crystals 104 is not exposed to those high VISNIR light levels. The two image sensors with the narrow-band optical bandpass filter 110 and/or the dichromatic coating on the common beam splitter 108 permits operation in any ambient light level; therefore, day and night operations are possible. Thus, this system allows laser detection in daylight and very low light conditions.

The upconversion layer 104 in the silicon-based image sensor 102 can have a further optimization of the heavy coating of a plurality of crystals intermixed with a dopant that is configured to convert short wave infrared (SWIR) light in the second range of wavelengths passed by the optical bandpass filter 110 into the light wavelengths of visible light to near infrared light in the third range of wavelengths. The heavy coating of the plurality of crystals intermixed with the dopant is more than or equal to 51% of the surface area of the silicon substrate of the silicon-based image sensor. In an embodiment, a heavy coating of crystals can be the plurality of crystals with the dopant that may be densely dispersed such that crystals overlie more than or equal to 99% of the surface area of the silicon substrate. In an embodiment, a heavy coating of crystals can be the plurality of crystals with the dopant that may be densely dispersed such that crystals overlie more than or equal to 80% of the surface area of the silicon substrate. In an embodiment, a heavy coating of crystals can be the plurality of crystals that may be densely dispersed such that crystals with the dopant overlie more than or equal to 51% of the surface area of the silicon substrate. In some examples, the plurality of crystals are substantially uniformly dispersed over the surface area of the silicon substrate. In some examples, crystals may range in size from greater than or equal to 0.1 micrometers (e.g., microns) and less than or equal to 100 micrometers. For example, crystals may range in size from about 0.1 micrometers to about 100 micrometers, or from about 1 micrometer to about 20 micrometers, or from about 5 micrometers to about 8 micrometers. For example, crystals may have an irregular shape, but each crystal may have an effective diameter of about 1 micrometer to about 20 micrometers, or from about 5 micrometers to about 8 micrometers. In some examples, the effective diameter of a crystal may correspond to the largest dimension (e.g., the longest length in a single direction) of the crystal. In some examples, the size of crystals may be defined by the structure of the lattice and/or lattice size, which may in turn be defined by the material and/or materials comprising the crystals.

The upconversion layer of crystals 104 in the silicon-based image sensor 102 also has a dopant selected to absorb incident electromagnetic radiation at the second range of wavelengths (e.g. 1550 nm+ or −25 nm) and to emit electromagnetic radiation at the third range of wavelengths (e.g. 930 nm to 980 nm) that is within a range of wavelengths that a silicon-based image sensor 102 implemented as the silicon-based image sensor 102 can detect. The dopant comprises a rare-earth element.

The silicon-based image sensor 102 is optimized to put a heavy coat of upconverting crystal layers so that the system really knocks out noise in order to solely capture the laser spot/pulse and then amplify the captured laser spot later in the imager control signal processing circuitry, so that captured laser spot then shows up much better, even in much brighter conditions. Whereas, in a prior technique, maybe the system was just kind of merging two images to allow viewing of the laser in darker conditions and just hoping that a user of the night vision camera could see that laser spot also in bright light conditions.

Next, the silicon-based image sensor 102 and the other image sensor 105 can have further optimizations including having different amounts of pixels on their corresponding image sensor array and operate at different frame rates, as well as being optimized for specific light wavelengths as discussed above. The silicon-based image sensor 102 with the upconversion layer of crystals 104 can have a smaller area than the other image sensor 105 (e.g. VISNIR imager) and fewer pixels. This can reduce power consumption and increase the SWIR frame rate for reading the laser PRF (pulse rate frequency) code. Thus, the silicon-based image sensor 102 and the other image sensor 105 have different amounts of pixels and then the silicon-based image sensor 102 can operate at a higher frame rate than the other image sensor 105 to allow the pulse repetition frequency decoder 106 to start the decoding of the pulse repetition frequency of the laser flash while the image data from the other image sensor 105 is still being collected.

The silicon-based image sensor 102 (e.g. the short wave infrared imager) may have fewer pixels on the image sensor than the other image sensor 105 (e.g. the VISNIR imager) and because of that this silicon-based image sensor 102 (e.g. the short wave infrared imager) will have a much higher frame rate because of fewer pixels to collect image data from; and therefore, will have more time to do the pulse repetition frequency decoding compared to the image data collected from the other image sensor 105 (e.g. the VISNIR imager). The faster processing allows the combining of the image data in the image frame from the two image sensors to occur faster in real time because of the shorter processing time as well as actually getting more accuracy in the pulse repetition decoding frequency can tell differences in small PRF differences such as between 1555 PRF and 1556 PRF. Thus, the laser detection system using multiple image sensors can operate in near real time.

In an embodiment, an optional optic, not shown in FIG. 1, can be placed in the SWIR/VISNIR path so the image can be magnified to occupy the focal plane for two dissimilar size imagers.

Present covert SWIR laser spotting cameras generally use imagers fabricated from InGaAs or possibly quantum dots. These approaches often require maintaining the imager at a temperature lower than ambient temperature using thermoelectric coolers (TEC) increasing SWaP. However, this multiple image sensors system does not need to operate at a temperature lower than ambient temperature.

The multiple image sensors also allow the first silicon-based image sensor 102 to use the upconverting crystals to take advantage of low noise and low dark current needed for night vision CMOS imagers.

In an embodiment, the narrow-band optical bandpass filter 110 and the common dichroic beam splitter 108 can be integrated as one component.

The silicon-based image sensor 102 with upconverting crystals and the other image sensor 105 allows the visual detection to see covert SWIR laser signals and the environment at the same time in a merged image. In an embodiment, the other image sensor 105 can be a wide band monochrome imager. Alternatively, as discussed, the other image sensor 105 can have a VISNIR channel that is a color imager. In yet another embodiment, any other type of image sensor can be used to reproduce an image of the background scene.

As discussed, the silicon-based image sensor 102 with the upconversion layer of crystals 104 (e.g. SWIR imager) uses the upconverting crystals to convert the SWIR laser pulses to a wavelength in a third wavelength range detectable by pixels implemented in silicon. The upconverting crystals can be electrically passive so they do not change the noise or dark current characteristics of the silicon imager.

In an embodiment, the narrow-bandpass optical bandpass filter 110 eliminates extraneous scene generated shot noise from the upconverting SWIR imager. This is needed due to relatively low upconversion quantum efficiency. This permits the use of the camera in bright sunlight or at any time. The laser signal can always be seen superimposed on the scene.

In an embodiment, the position of each image sensor is set to compensate for chromatic aberration causing differences in focal point location for VISNIR and SWIR wavelengths.

As discussed in more detail later, the pulse repetition frequency decoder cooperates with the upconversion layer of crystals 104 to decode a pulse repetition frequency of a laser flash in the second range of wavelengths passed by the optical bandpass filter 110 and subsequently upconverted into the third range of wavelengths and then captured by the one or more pixels of the silicon-based image sensor.

Again, the first range of wavelengths can be Visible and Near Infrared wavelengths (e.g. VISNIR 400 nm-2550 nm) going to the other image sensor 105 (e.g. VISNIR imager). The second range of wavelengths can be a narrow band within Short Wave Infrared wavelengths (e.g. 1550 nm+ or −25 nm) that go to the silicon-based image sensor 102 SWIR imager. The third range of wavelengths (e.g. 930 to 980 nm) goes to the pixels from the upconversion layer of crystals 104. Note, that in an embodiment, other wavelength limits/numerical ranges can be used.

Some additional advantages of the laser detection system using multiple image sensors include: (i) The cost of the other image sensor 105 (e.g. VISNIR imager) and the silicon-based image sensor 102 with the upconversion layer of crystals 104 (e.g. upconverting imager) is very low compared with, for example, InGaAs detector-based cameras. (ii) The silicon-based image sensor 102 with the upconversion layer of crystals 104 can operate in certain situations without the need for cooling due to low dark current. This gives a significant power advantage over InGaAs and quantum dot cameras. (iii) SWIR camera users can easily switch to the CMOS-based silicon-based image sensor 102 with the upconversion layer of crystals 104 because of SWAP-C advantage. These cameras are used heavily for covert SWIR laser spotting. (iv) Due to its small size and low cost, the laser detection system using multiple image sensors makes possible large scale laser warning detectors on vehicles as well as on a person. (v) Much lower SWaP-C and higher quality daytime imaging capable of seeing low energy SWIR laser signals along with better imaging of the scene for moonlight up to and including bright sunlight.

In an embodiment, the image data from the pixels in the silicon-based image sensor 102 and the image data from the pixels in the silicon-based image sensor 102 can be digitally combined in the image processing unit 112 to produce a high-quality image with the laser image overlayed. Therefore, laser spotting will not be degraded by daylight. The laser detection system using multiple image sensors can be considered a high-quality color camera which can see covert SWIR lasers.

An embodiment of this system has no separate optical bandpass filter 110 but instead has a dichromatic coating put onto the common beam splitter 108. Thus, this embodiment does not have the optical bandpass filter 110 but rather has the dichromatic coating on the common beam splitter 108. A "dichromatic coating" on a common optical beam splitter 108 refers to a special coating that selectively transmits or reflects light based on its wavelength, essentially acting as a wavelength-specific filter, allowing the beam splitter 108 to separate different colors and/or NIR and or SWIR wavelengths of light into distinct paths effectively separating wavelength ranges based on its particular wavelength. These coatings are typically applied to the surface of a glass substrate, often within a prism design, to achieve the desired wavelength separation. The dichromatic coating on the common beam splitter 108 can make the beam splitter 108 into a wavelength cutoff filter and/or wavelength bandpass filter to pass some of the light to be incident on the upconversion layer of crystals 104 in a second range of wavelengths, such as a narrow-band within the short wave infrared wavelengths, which will be absorbed and converted by the upconversion layer of crystals 104 into a third range of wavelengths, which is different than the first and second range of wavelengths, and then the light in the third range of wavelengths is transmitted to the one or more pixels in the silicon-based image sensor. The dichromatic coating on the common beam splitter 108 can cause a wavelength cutoff and merely direct wavelengths above 1500 nm to be reflected at a 90° angle up towards the silicon-based image sensor 102 with the upconversion layer of crystals 104 while passing i) all wavelengths or ii) merely wavelengths below 1500 nm to the other image sensor 105 (e.g. the VISNIR imager). Thus, the dichromatic coating on the common beam splitter 108 can make beam splitting action into a wavelength cutoff filter to pass merely the light in the second range of wavelengths of equal to or greater than 1500 nanometers to be incident on the upconversion layer of crystals 104 in the silicon-based image sensor.

The dichromatic coating on the common beam splitter 108 can form either a wavelength cutoff filter and/or a wavelength band pass filter as long as a heavy coating of crystals is used in the silicon-based image sensor 102 with the upconversion layer of crystals 104. The upconversion layer is configured to cooperate with the dichromatic coating on the common beam splitter 108 to filter out wavelengths outside of the second range of wavelengths from being detected by one or more pixels in the silicon-based image sensor 102. The heavy coating of the upconversion layer in the silicon-based image sensor 102 naturally acts as a filter itself to capture merely wavelengths in the 1550 nm+ or −25 nm range (and thus, naturally filter out the noise and other wavelengths of no interest to this imager) and then upconversion layer of crystals 104 in the silicon-based image sensor 102 upconverts those wavelength of 1550+ or −25 nanometers of wavelengths corresponding to the laser flash that the system is interested in capturing. Therefore, the system does not have to have an optical bandpass filter 110. Again, the upconversion layer 104 in the silicon-based image sensor 102 has a heavy coating of a plurality of crystals intermixed with a dopant that is configured to convert the short wave infrared light passed by the dichromatic coating on the common beam splitter 108 and then absorbed in the upconversion layer 104 into the wavelengths of i) visible light to ii) near infrared light in the third range of wavelengths transmitted to the one or more pixels in the silicon-based image sensor. The heavy coating of the plurality of crystals intermixed with the dopant can be more than or equal to, 51%, 80%, or 99% of a surface area of silicon substrate of the silicon-based image sensor. The first channel of image data from the SWIR wavelengths going into the image processor unit will still only have wavelengths roughly corresponding to the laser flash; and thus, the high gain will still merely amplify that captured laser flash rather than all wavelengths, which would cause increased general noise across all of the wavelengths.

In an embodiment, the dichromatic coating on the common beam splitter 108 is simply a cutoff filter; and thus, reflects all wavelengths above 1500 nanometers towards the silicon-based image sensor 102 with the upconversion layer of crystals 104 and then the upconversion layer of crystals 104 in the first imager can have the heavier coating of crystals on the surface area, which will act to further filter just the wavelengths of 1550+−25 nm that the upconversion layer of crystals 104 is capturing and then emitting into the third wavelength of 930 to 980 nanometers. All of the other wavelengths below 1500 nanometers are directed toward the other image sensor 105. Thus, a very inexpensive and easy coating of a cutoff frequency applied to the beam splitter 108 directs the SWIR wavelengths at 90°, which is easily implemented, and then the density of the crystals works as a secondary filter to block undesired wavelengths from reaching the pixels in the silicon-based image sensor.

The pulse repetition frequency decoder and the image processing unit 112 process the image data from the respective image sensors as previously described. For example, the pulse repetition frequency decoder cooperates with the upconversion layer of crystals 104 to decode a pulse repetition frequency of a laser flash in the second range of wavelengths passed by the dichromatic coating on the common beam splitter 108 and then was subsequently upconverted and then captured by one or more pixels of the silicon-based image sensor.

Additional Details

Figure 2:
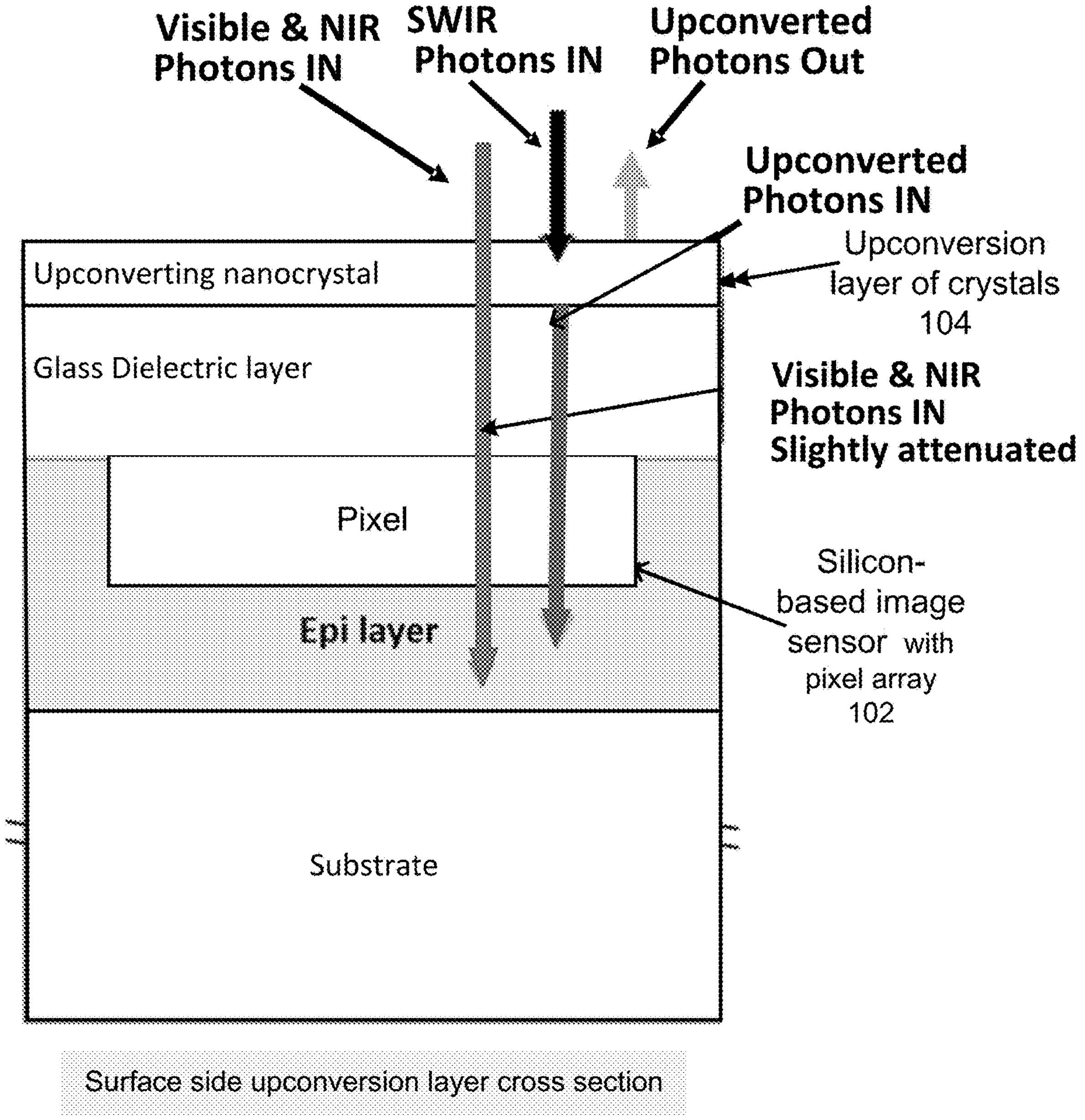
FIG. 2 illustrates a block diagram of an embodiment of an example silicon-based image sensor that has i) a pixel array with one or more pixels and ii) an upconversion layer of crystals on the front side of the silicon-based image sensor.

FIG. 2 illustrates a block diagram of an embodiment of an example silicon-based image sensor that has i) a pixel array with one or more pixels and ii) an upconversion layer of crystals on the front side of the silicon-based image sensor. FIG. 2 shows an example cross section of layers of an example chip of the silicon-based image sensor 102 and an upconversion layer of crystals 104. The upconversion layer of crystals 104 is located layer wise on the front side of the silicon-based image sensor 102. The layers of the example chip with the image sensor can include an upconverting nanocrystal layer, a glass dielectric layer, a silicon-based image sensor 102 with a pixel array, an Epitaxial (EPI) layer, and a substrate.

An integrated circuit is made out of various materials including a substrate and then layers are built on top of that substrate in order to make an image sensor for a camera. On one of the layers built on the substrate that layer will have photodiodes with transistors to make pixels. Each photodiode in a pixel is going to absorb light and then generate an electronic signal out. The electronic signal out of the pixels of the image sensor will be collected and put together to make an image based file such as a JPEG and/or an MPEG. The upconverting nanocrystal layer over or under the image sensor with its photodiodes making up the imager layer can also be located on the same integrated circuit.

An object and/or a person may have a laser on or associated with them that can convey information in non-visible wavelengths, such as short wave infrared (SWIR) wavelengths, in order to identify them as friend or foe. The laser can shoot out a laser pulse every now and then, and from that laser pulse, then the upconversion layer of crystals 104 cooperating with the pulse repetition frequency decoder 106 can figure out a specific identity of the laser creating the laser pulse; and thus, for example, whether that person or object (e.g. a piece of equipment) is something the system should shoot at, or a person or a piece of equipment that we should not shoot at. See for example FIG. 4.

The incident light wavelengths of the captured image are going from top to bottom. For example, the incident light wavelengths captured in the image, including the laser pulse, can include SWIR light, visible light, and near-infrared (NIR) light, which then go into the upconversion layer of crystals 104 on the front side of the silicon-based image sensor 102. The incident light wavelengths in the wavelengths of visible light and NIR light will pass right through the upconversion layer of crystals 104 onto the silicon-based image sensor 102 (e.g. CMOS imager) with the pixel array.

The upconverted nanocrystal layer 104 is designed to receive incident light wavelengths in the wavelengths of, for example, non-visible light in a high energy laser pulse, and because of the crystalline structure and some dopants in the upconverted nanocrystal layer 104, then absorb the energy in the wavelengths of the laser pulse and then emit light in a different wavelength that the silicon-based image sensor 102 can detect. The pulse repetition frequency decoder 106 can analyze the intensity of the pulse and the natural emission decay of that pulse in the upconverted nanocrystal layer 104 to identify a semi unique pattern of that laser pulse, and then measure a gap in time between capturing that same pattern of that laser pulse in order to obtain a pulse repetition frequency of the laser and other information about the laser pulse in order to match that information up to a specific type and identity of a laser that generated the laser pulse. In an example, one can then match the identity of a laser that generated the laser pulse to whether that corresponds to a laser that a friend or foe uses.

FIG. 3*a* illustrates a block diagram of an embodiment of an example silicon-based image sensor that has i) a pixel array with one or more pixels and ii) an upconversion layer of crystals on the backside of the silicon-based image sensor. FIG. 3*a* shows the cross section of layers of the example chip of the silicon-based image sensor 102 and an upconversion layer of crystals 104. The upconversion layer of crystals 104 is located layer-wise on the back side of the silicon-based image sensor 102. The layers of the example chip with the image sensor can include an upconverting nanocrystal layer, a glass dielectric layer, a transparent cavity layer, a silicon-based image sensor 102 with a pixel array, a SWIR/NIR/VIS reflector, an anti-reflection coating, an epitaxial (EPI) layer, and a substrate. The incident light wavelengths of the captured image are going from the bottom to the top.

Figure 3B:
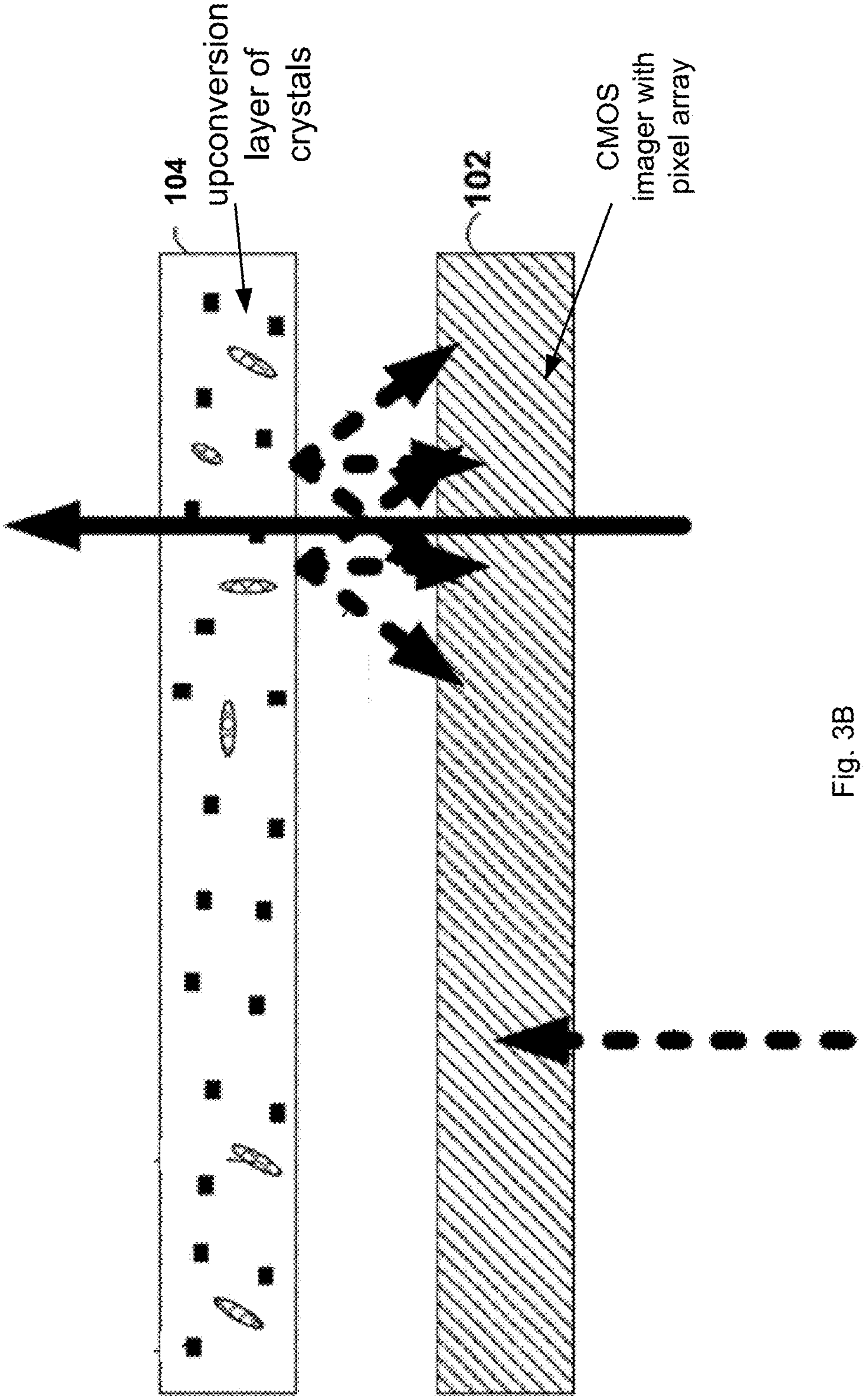
FIG. 3*b* illustrates a block diagram of an embodiment of an example upconversion layer of crystals that has a dopant selected to absorb incident electromagnetic radiation in the light at a first range of wavelengths and to emit electromagnetic radiation at a second range of wavelengths that is within a wavelength range that the pixels on the silicon-based image sensor are able to detect.

FIG. 3*b* illustrates a block diagram of an embodiment of an example upconversion layer of crystals 104 that has a dopant selected to absorb incident electromagnetic radiation in the light at a first range of wavelengths, (e.g., greater than or equal to 1000 nm, such as SWIR), and to emit electromagnetic radiation at a second range of wavelengths, (e.g., less than 1000 nm, such as visible light and NIR light), that is within a wavelength range that the pixels on the silicon-based image sensor 102 are able to detect. The crystals may be made of a material and/or compound configured to absorb electromagnetic radiation in a particular wavelength and then emit/transmit light in another wavelength. In some examples, crystals may comprise gadolinium oxysulfide, aluminum oxide (Al2O3), or a similar compound. Likewise, dopants may be made of a material and/or compound configured to absorb electromagnetic radiation in a particular wavelength and then emit/transmit light in another wavelength. The dopant can include a rare-earth element, e.g., erbium, ytterbium, or any suitable rare-earth element.

The silicon-based image sensor 102 with the pixel array may have a photo-sensitive silicon substrate, such as e.g., complementary metal-oxide semiconductor (CMOS) and/or charge coupled device (CCD) pixel arrays) configured to detect visible light and/or portions of NIR light. Next, the pixel array with the one or more pixels on the silicon-based image sensor 102 cooperating with the upconversion layer of crystals 104 is configured to detect light wavelengths in one or more of ultraviolet (UV) light (e.g. 100 to 400 nm), visible light (e.g. 380 to 700 nm), and some NIR light (e.g. 1000 to 2500 nm). In an embodiment, the pixel array with the one or more pixels on the silicon-based image sensor 102 cooperating with the upconversion layer of crystals 104 is configured to detect light wavelengths in all three of the UV light, visible light, and NIR light.

Thus, the upconversion layer of crystals 104 has a plurality of crystals intermixed with a dopant that is configured to convert, for example, SWIR light (e.g. 700 to 1700 nm) to the light wavelengths of the visible light and/or the NIR light. The crystals and dopant can absorb a portion of the incident light and then isotopically emit light. In an example, the upconversion layer of crystals 104 has a plurality of crystals with a dopant that convert electromagnetic radiation in a first range of wavelengths greater than 1000 nm to electromagnetic radiation in a second range of wavelengths less than or equal to 1000 nm. Next, the pixels of the photo-sensitive silicon substrate detect the electromagnetic radiation from the emissions from the upconversion layer of crystals 104 in the second range of wavelengths.

Thus, in the upconversion layer of crystals 104 located on the backside embodiment, all light (Visible light, InfraRed light, UV light, X Rays, microwaves, etc. with or without a laser pulse) that comes in will be shined on the CMOS imager with the pixel array and then onto the upconversion layer of crystals 104. In the silicon-based image sensor 102, some wavelengths will be absorbed/sensed/detected by the silicon substrate, the photodiode, and/or the epitaxial layer. Light in the wavelengths of visible light and near infrared light will be sensed/detected by the silicon-based image sensor 102 with the pixel array. Note, a portion of the wavelengths of the incident light may transmit through the silicon substrate and dielectric layer of the silicon-based image sensor 102 to be incident on the upconversion layer of crystals 104. Light in the wavelengths of, for example, short wave infrared (SWIR) will interact with the crystals and dopants in the upconversion layer of crystals 104. Some of that light, e.g. a photon in an IR wavelength, will come into the upconversion layer of crystals 104 and be converted to, for example, light in a visible wavelength frequency signal. Thus, the higher, longer wavelength light is converted to a lower, shorter wavelength of light. The upconversion layer of crystals 104 has a dopant selected to absorb the incident electromagnetic radiation at a first range of wavelengths (e.g., greater than or equal to 1000 nm) and then to emit electromagnetic radiation at a second range of wavelengths (e.g., less than 1000 nm) that is within a wavelength range that the silicon substrate is able to detect. A first portion of the light is emitted isotopically from the upconversion layer and can propagate away from the silicon substrate and otherwise be lost (e.g., unconverted and not sensed/detected) without the presence of the reflector. The transparent layer may be a spacer with a tailored thickness and/or index of refraction and configured to work in conjunction with at least the reflector to form an etalon to increase at least a portion of the wavelengths of the light reflected, e.g., a Fabry-Perot type etalon. However, most of the converted shorter wavelength light into visible light from the upconversion layer of crystals 104 will be sent directly to the CMOS imager with the pixel array. In an example, 30% of the SWIR light will be converted and reflected out away from the image sensor, and about 70% of the SWIR light will be converted and sent directly to the pixel array to be captured. The electrical signals generated by the pixels will be sent to the pulse repetition frequency decoder 106. See FIG. 4. The pulse repetition frequency decoder 106 thus cooperates with the upconversion layer of crystals 104 to decode a pulse repetition frequency of a laser flash captured by one or more of the pixels.

In general, the pulse repetition frequency decoder 106 cooperates with an image sensor 102 that has a pixel array with one or more pixels on a silicon substrate, such as a complementary metal-oxide semiconductor (CMOS) and/or charge coupled device (CCD)—pixel array. The image sensor 102 is configured to detect ultraviolet (UV), visible, and near-infrared (NIR) light up to 1100 nm and an upconversion layer of crystals 104 has a plurality of crystals configured to convert short wave infrared light to UV light, visible light, or NIR light wavelengths under 1000 nm. An example silicon-based image sensor 102 includes an upconversion layer comprising a plurality of crystals 104 configured to convert electromagnetic radiation comprising a first range of wavelengths greater than 1000 nm to electromagnetic radiation comprising a second range of wavelengths less than or equal to 1000 nm and one or more pixels on a silicon substrate configured to detect the electromagnetic radiation comprising the second range of wavelengths. The upconversion layer of crystals 104 includes crystals having a dopant selected to absorb the incident electromagnetic radiation at a first range of wavelengths (e.g., greater than or equal to, for example, 1000 nm) and to emit electromagnetic radiation at a second range of wavelengths (e.g., less than 1000 nm). In this way, the silicon-based image sensor 102 cooperating with the upconversion layer of crystals 104 may be used to detect, in the normal case, both shorter wavelength light within the second range of wavelengths, e.g., UV, visible, and NIR light, as well as longer wavelength light within the first range of wavelengths that the photosensitive silicon substrate would not otherwise be capable of detecting.

The layer of upconverting nanocrystals 104 is going to absorb wavelengths of light from that laser pulse and emit a second wavelength captured by the pixels that can show both the intensity of the laser pulse and then how long it takes for the crystals and dopant to decay back down to a ground state. Based on that detected laser pulse pattern and a gap of time until the next time the same laser pulse pattern is detected again, then the pulse repetition frequency detector 106 can decode the detected laser pulse into a specific known laser that emits that type of laser pulse. And in an example, then correlate the identity of the type of laser into being a friend or foe. (See FIGS. 5 and 6)

The techniques of the pulse repetition frequency detector 106 cooperating with the upconversion layer of crystals 104 may also extend the wavelength range sensitivity of a silicon-based image sensor 102, e.g., to the SWIR, MWIR, LWIR, or other electromagnetic wavelength ranges.

Figure 4:
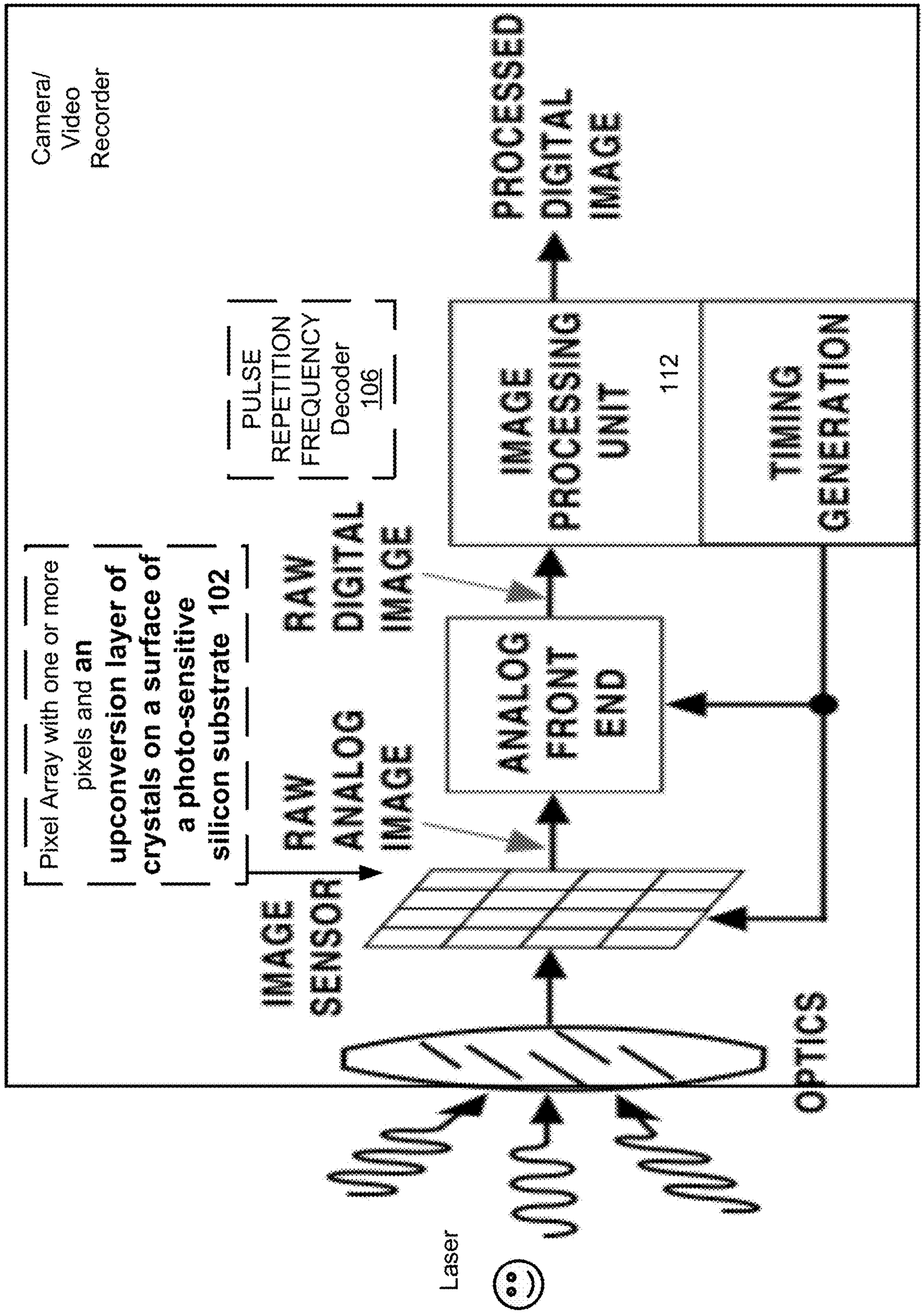
FIG. 4 illustrates a block diagram of an embodiment of an example pulse repetition frequency decoder in an example device that cooperates with the upconversion layer of crystals and silicon-based image sensor to decode a pulse repetition frequency of a laser flash captured by one or more of the pixels of the silicon-based image sensor.

FIG. 4 illustrates a block diagram of an embodiment of an example pulse repetition frequency decoder in an example device that cooperates with the upconversion layer of crystals and silicon-based image sensor to decode a pulse repetition frequency of a laser flash captured by one or more of the pixels of the silicon-based image sensor 102.

A laser on the outside of the camera pulses, and the incident light captured by the camera, including the laser pulse, goes through the lens of the camera into the silicon-based image sensor 102 that has i) a pixel array with one or more pixels and ii) an upconversion layer of crystals 104. The laser emits a laser pulse whose wavelengths go in through the optics (e.g. the lens of the camera), the upconversion layer of crystals 104 interacts with the wavelengths corresponding to the laser pulse, and then the image sensor 102 collects all of the electronic signals from the pixels, for example, every 60th of a second, e.g. 60 hertz. The collected data from the pixels of the imager goes into the image processing circuitry that eventually turns that collected data into images in, for example, an MPEG or a JPEG, as well as the collected data can be analyzed by the pulse repetition frequency decoder 106.

The silicon-based image sensor 102 that has the pixel array with one or more pixels may be a semiconductor device for converting an optical image into electric signals. The silicon-based image sensor 102 that has i) a pixel array with one or more pixels capable of detecting light in the ultraviolet (UV), visible, and/or near infrared (NIR, e.g., up to about 1100 nanometers (nm)) wavelength ranges. Note, previous image sensors configured to detect light having wavelengths greater than 1100 nm, e.g., short wave infrared (SWIR), mid-wave infrared (MWIR), and/or long wave infrared (LWIR) are typically expensive due to the need to use materials and/or techniques capable of detecting the lower energy light, e.g., indium gallium arsenide (InGaAs), mercury cadmium telluride (HgCdTe), germanium, lead sulfide (PbS), indium antimonide (InSb), indium arsenide (InAs), lead selenide, lithium tantalate (LiTaO3), platinum silicide (PtSi), microbolometers, photomultiplier tubes, and the like as well as a need to operate at very high frame rates of up to 50,000 Hz.

The silicon-based image sensor 102 that has i) a pixel array with one or more pixels and ii) an upconversion layer of crystals 104 and the pulse repetition frequency decoder 106 can detect and decode a laser designator. The upconversion layer of crystals 104 can be deposited as part of the die packaging process. The upconversion layer of crystals 104 which acts to detect the laser pulse is located on the chip with the pixels of the image sensor 102. The upconversion layer of crystals 104 converts low energy, for example, SWIR photons, directly into a visible image wavelength, avoiding intermediate electronics and an external display for image visualization, which can be sensed by the pixels. In an embodiment, the silicon-based image sensor 102 that has i) a pixel array with one or more pixels and ii) an upconversion layer of crystals 104 and the pulse repetition frequency decoder 106 can convert SWIR laser spots to a wavelength detectable by silicon via the use of high efficiency upconverting nanocrystals (UPNC) in the upconversion layer of crystals 104. The silicon-based image sensor 102 that has i) a pixel array with one or more pixels and ii) an upconversion layer of crystals 104 and the pulse repetition frequency decoder 106 can detect, for example, laser pulses of 1550 nm and/or 1064 nm designators at 5-10 km. The decoding of a laser pulse of a friendly force's laser designator and its geographic location can be determined under both lighting conditions day or night and within the capture image scene context. The silicon-based image sensor 102 that has i) a pixel array with one or more pixels and ii) an upconversion layer of crystals 104 and the pulse repetition frequency decoder 106 can use a back illuminated sandwich of the upconversion layer of crystals 104 to achieve a highest night vision and SWIR sensitivity. See FIG. 3*b*.

The incident light captured in that frame of light by the image sensor 102 includes the laser pulse, then it goes into the standard electronics of how the camera determines and creates an image file, such as a JPEG, an MPEG, etc., through the image processing circuits.

The pulse repetition frequency decoder 106 can be located in an imaging pipeline of the camera, located off a chip that contains the silicon-based image sensor 102 that has the pixel array. The pulse repetition frequency decoder 106 can be implemented in electronic circuits, not located on the chip with the silicon-based image sensor 102 in the camera, in order to reduce imager power dissipation, which would otherwise result in heating and an increase in dark current shot noise.

The pulse repetition frequency decoder 106 is included with other electronic circuits designed to capture and process the light captured in a frame because although the camera is capturing the objects of interest in the image, e.g., who is in that image or what object in that image the camera is also capturing the laser pulses, which can indicate whether that person or object in the captured image is friend or foe based on the pulse repetition frequency decoder 106 identifies the captured laser pulse with that object.

The pulse repetition frequency decoder 106 relies on the upconversion layer of crystals 104, either on top of the pixel array or on a bottom of the pixel array, to do the data collection of the laser pulse wavelengths and pass that information to the pixel array and then into the processing electronics of the pulse repetition frequency decoder 106 to keep track of the laser pulse event and perform the decoding of the laser's identity. The pulse repetition frequency decoder 106 could also be configured to receive a signal or otherwise detect when the upconversion layer of crystals 104 absorbs a laser pulse.

The pulse repetition frequency decoder 106 is configured to cooperate with the upconversion layer of crystals 104 to decode a pulse repetition frequency of a laser flash captured by one or more of the pixels of the silicon-based image sensor 102. The pulse repetition frequency decoder 106 can then track the time gap to when the next laser pulse is happening. The periodicity between tracked laser pulses is basically a frequency number (between the time periods of when the laser pulses occur), and that can be looked up in the lookup table to identify that this most likely corresponds to this type of laser beam from this laser is being shined and captured by the decay of the upconversion layer of crystals 104. The pulse repetition frequency decoder 106 is configured to use the decoded pulse repetition frequency to determine an identity of a laser that produced the laser flash captured by one or more of the pixels by comparing the pulse repetition frequency to known codes of lasers. The known codes of lasers, corresponding to the pulse repetition frequency, can be found and put into a database from, for example, various documents. Thus, the pulse repetition frequency decoder 106 can decode the decay of the upconverting crystals by measuring both its peak intensity and the decay time of the upconverting emissions from the upconversion layer of crystals 104, which can translate to a code, and then compare that currently detected PRF code to a lookup table in database and/or list of known PRF codes to corresponding laser types and versions of lasers.

The pulse repetition frequency decoder 106 has a benefit that there is no need for additional high speed dedicated circuitry, such as circuitry that processes at a frame rate of 50,000 frames per second to capture the laser pulses, which have a very short duration. The pulse repetition frequency decoder 106 cooperating with the upconversion layer of crystals 104 and the silicon-based image sensor 102 allows the camera to run at a relatively slow speed, e.g. 60 to 90 hertz frame rate, and still detect a laser pulse as well as actually decode the laser pulse to a known laser. The pulse repetition frequency decoder 106 cooperates with the upconversion layer of crystals 104 and the up converting layer's convergence detection of an instantaneous high spike start and a slow emission. See FIGS. 5 and 6. The pulse repetition frequency decoder 106 can integrate the intensity between the frames of images. The pulse repetition frequency decoder 106 can detect when exactly the peak portion happens. The pulse repetition frequency decoder 106 can detect when the peak of the laser pulse is between the frames, before the frame, or after the frame. The pulse repetition frequency decoder 106 can look at the intensity or integral value of the intensity and actually tell the exact timing of the laser firing the pulse. Note, the pulse repetition frequency decoder 106 and the imaging circuitry both operating at 60 to 90 hertz/frame rate does not incur a power consumption penalty for having one portion on the camera circuitry that has to be running really fast 10,000-50,000 Hz. Meanwhile, the other side on the camera circuitry is just doing the imaging for the camera operating at a standard 60-90 hertz. Thus, the pulse repetition frequency decoder 106 cooperating with the silicon-based image sensor 102 that has i) a pixel array with one or more pixels and ii) an upconversion layer of crystals 104 on at least one of the front side and a backside of the silicon-based image sensor 102 can be detect and decode the laser pulse without adding any power penalty. Also, the pulse repetition frequency decoder 106 cooperating with the silicon-based image sensor 102 that has i) a pixel array with one or more pixels and ii) an upconversion layer of crystals 104 on at least one of the front side and a backside of the silicon-based image sensor 102 can integrate the intensity of a captured frame to detect and decode the laser pulse without adding any additional electronic circuitry to do the decoding of what region within the imager has detected the fired laser pulse.

Figure 5:
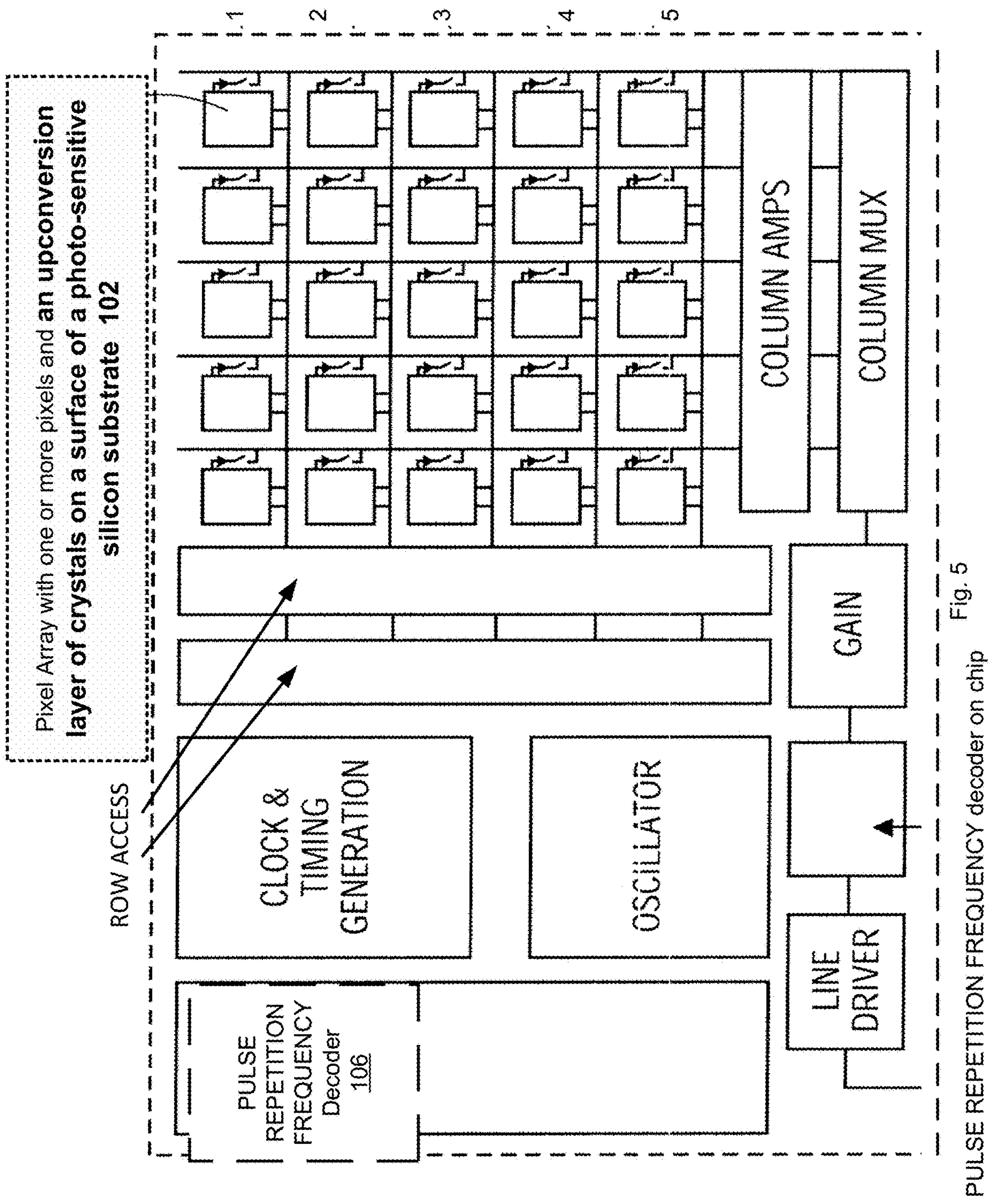
FIG. 5 illustrates a block diagram of an embodiment of an example pulse repetition frequency decoder and its associated circuitry located on a chip containing the silicon-based image sensor that has the pixel array.

FIG. 5 illustrates a block diagram of an embodiment of an example pulse repetition frequency decoder and its associated circuitry located on a chip containing the silicon-based image sensor that has the pixel array. A difference between FIG. 4 and FIG. 5 is the real estate location of where the pulse repetition frequency decoder 106 is implemented. The space housing the electronics for the pulse repetition frequency decoder 106 can be located on the chip housing the image sensor 102. In some embodiments, there is enough memory and other space on the chip with the image sensor 102, so that the electronics and the memory and everything else that you need are located on the real estate of that chip.

Figure 6:
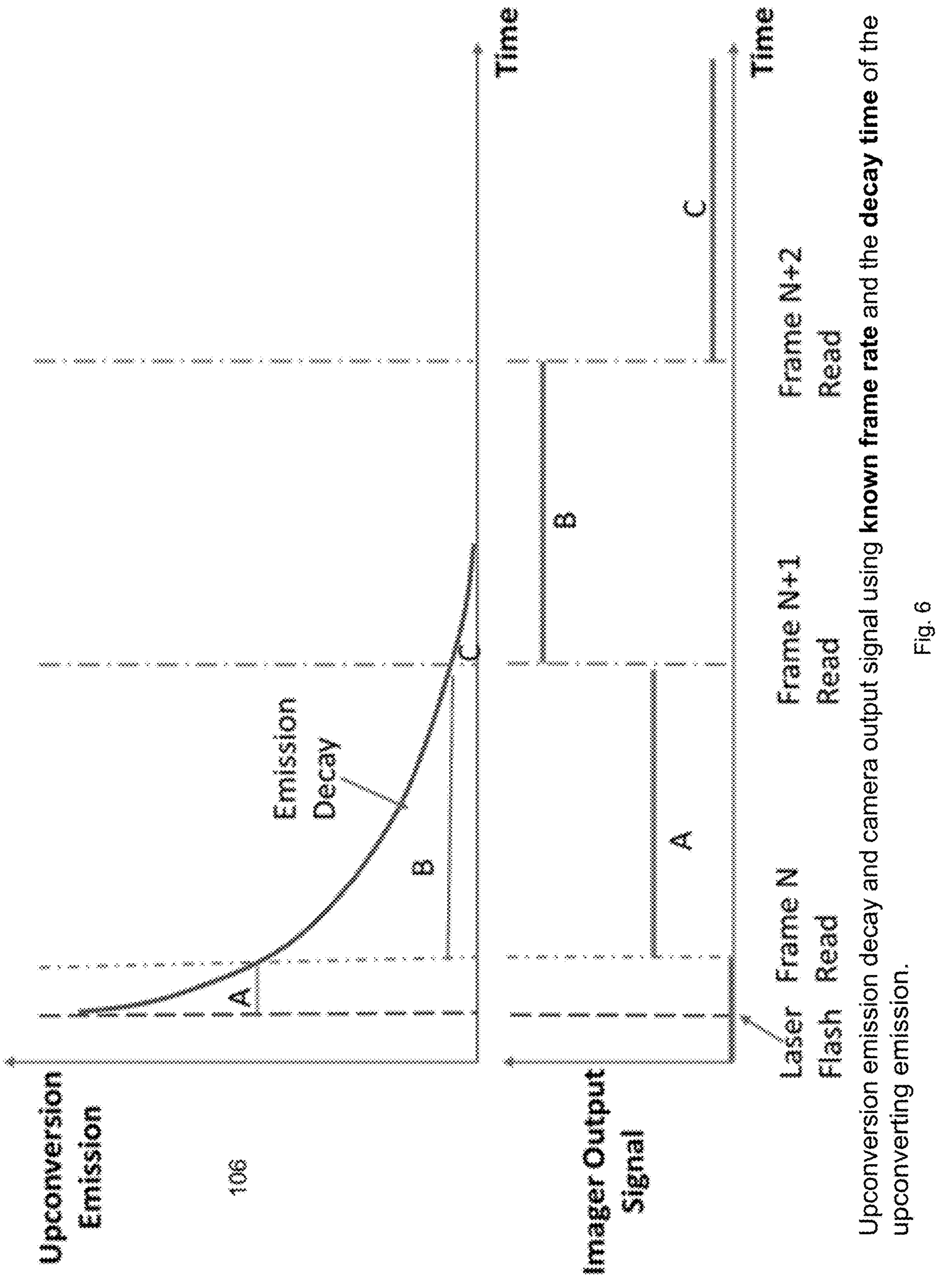
FIG. 6 illustrates a block diagram of an embodiment of an example pulse repetition frequency decoder configured to use a known frame rate of the silicon-based image sensor and a decay time of an upconverting emission from the upconversion layer of crystals to decode the pulse repetition frequency of the laser flash.

FIG. 6 illustrates a block diagram of an embodiment of an example pulse repetition frequency decoder configured to use a known frame rate of the silicon-based image sensor and a decay time of an upconverting emission from the upconversion layer of crystals to decode the pulse repetition frequency of the laser flash. In FIG. 6, the top graph shows the actual capture of the energy by the pixels from the upconversion emission decay from the upconversion layer of crystals 104. The bottom graph is the output signal of the silicon-based image sensor 102 corresponding to wavelengths captured by the pixels.

The captured frame rate of the silicon-based image sensor 102 operates on, for example, 60 or 90 hertz. The silicon-based image sensor 102 collects the electronic signals from all of the pixels in each frame. The silicon-based image sensor 102 feeds that collected data into the imaging processing pipeline and the pulse repetition frequency decoder 106 to operate upon.

Figure 7:
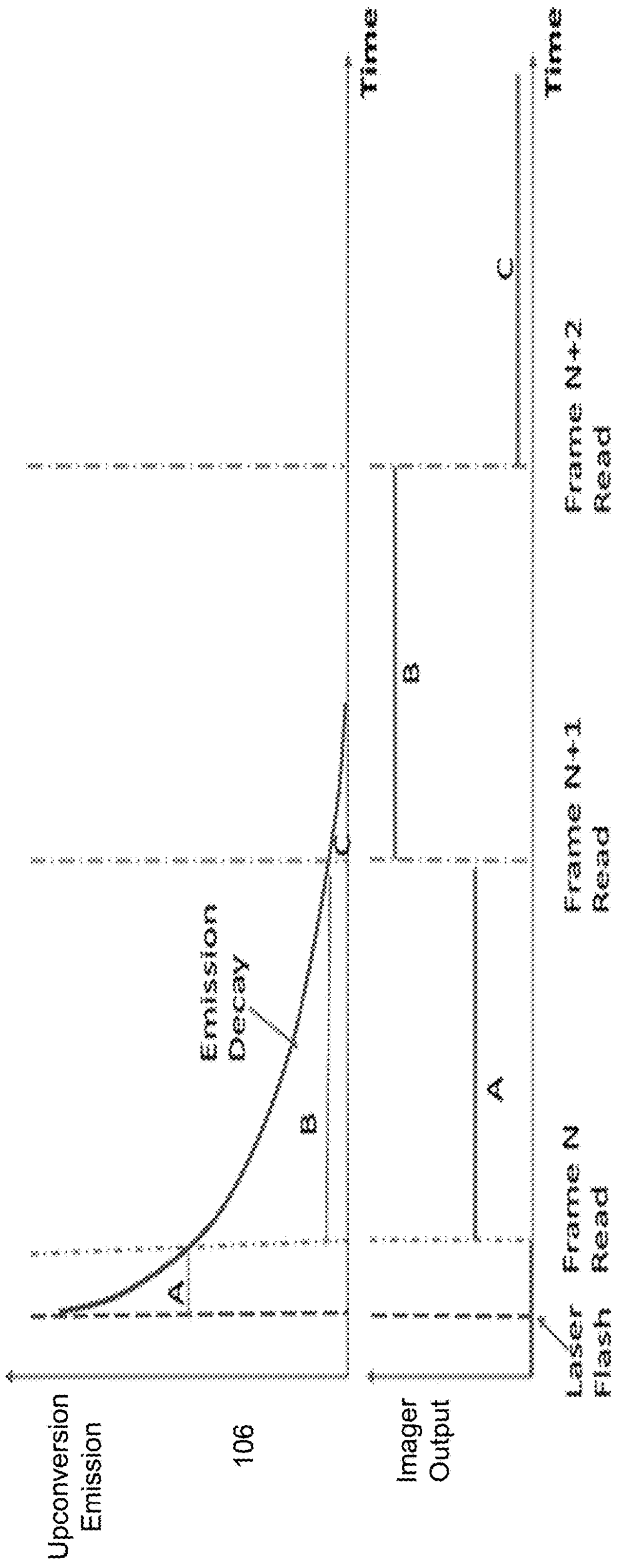
FIG. 7 illustrates a block diagram of an embodiment of an example pulse repetition frequency decoder configured to use an area under an emission curve that provides a photon signal at a first time period that spans from a first frame read post capture of the laser flash until one or more frame reads later, when electrons in the crystals with a dopant in the upconversion layer of crystals have decayed from a higher energy state than their ground energy state down to the ground energy state in order to determine the pulse repetition frequency of the laser flash.

FIG. 7 illustrates a block diagram of an embodiment of an example pulse repetition frequency decoder configured to use an area under an emission curve that provides a photon signal at a first time period that spans from a first frame read post capture of the laser flash until one or more frame reads later, when electrons in the crystals with a dopant in the upconversion layer of crystals have decayed from a higher energy state than their ground energy state down to the ground energy state in order to determine the pulse repetition frequency of the laser flash. FIG. 7 shows the same two graphs used by the example pulse repetition frequency decoder 106 in FIG. 6 but with short summaries to enhance what is visually happening. FIGS. 5 and 6 explain how an embodiment of an example pulse repetition frequency decoder 106 is possibly going to perform its functionality to decode the pulse repetition frequency of one or more laser pulses in the captured image over to an identity of each of the lasers emitting a laser pulse (and then that identity of the laser as to whether the object associated with that laser is, for example, friend or foe).

Summary of the Example Process

The pulse repetition frequency decoder 106 uses the image sensor and the upconversion layer of crystals 104 to capture one or more laser flashes/pulses. The laser pulse will have this really high spike of intensity as shown in the upconversion emissions graph and the corresponding imager output signal graph and so that is how the pulse repetition frequency decoder 106 knows that the pulse repetition frequency of the laser has started. Over the next series of captured frames, the nano crystals and the dopants in the upconversion layer of crystals 104 are going to decay from this high energy state down to the ground energy state. Note, the decay can be a function of crystal type and density of crystals. As long as crystal density is standardly produced, then the decay curve for crystal emission should be consistent and accurate. The pulse repetition frequency decoder 106 will detect that decay in upconversion emissions over the series of frame reads from the image sensor of a first frame read N to a frame read of N+2 when the decay in upconversion emissions has returned to a ground energy state. The pulse repetition frequency decoder 106 will use that pattern to be the measure of a first laser pulse. The pulse repetition frequency decoder 106 then looks for the next laser pulse in a series of laser pulses from the laser in order to determine the pulse repetition frequency of the laser flash. The pulse repetition frequency decoder 106 thus looks for the next time the image sensor cooperating with the upconversion layer of crystals 104 captures a similar a high intensity peak and very similar decay pattern. The pulse repetition frequency decoder 106 stores the captured high intensity peak and very similar decay pattern for comparison as well as a timer/counter provides the gap of time in between the occurrence of the pulses corresponding to the captured high intensity peak and very similar decay pattern to decode that into a pulse repetition frequency of a specific laser of known identity. In an example, the pulse repetition frequency decoder 106 can determine the characteristics of the pulse repetition frequency under analysis and then compare that over to a table that says, if the decoder has detected roughly this intensity of the laser pulse at this pulse repetition frequency that means the identity of the laser generating this laser pulse is laser 5 4 9, and friendly units from the United Kingdom use laser 5 4 9. Thus, the pulse repetition frequency decoder 106 uses a combination of known imager frame rate and the decay time of electrons from a state of higher energy to a ground state (e.g. decay of upconverting emission) coming from/resulting from an incoming laser energy to measure/calculate/determine the pulse repetition frequency.

Overall, a silicon-based image sensor 102 that has i) a pixel array with one or more pixels and ii) an upconversion layer of crystals 104 on at least one of a front side and a backside of the silicon-based image sensor 102. The pulse repetition frequency decoder 106 is configured to use an area under an emission curve that provides a photon signal at a first time period of a first frame read N post capture of the laser flash until one or more frame reads later, when electrons, in crystals with a dopant in the upconversion layer of crystals 104, have decayed from a higher energy state than their ground energy state down to the ground energy state in order to determine the pulse repetition frequency of the laser flash. Thus, the silicon-based image sensor 102 and the upconversion layer of crystals 104 cooperate with the pulse repetition frequency decoder 106 to capture a laser flash and the use that captured laser flash/pulse to determine its intensity and its known decay time and its time periodicity between laser pulses to be able to decode what the identity of that pulse repetition frequency of the laser flash is. And then based on that, the pulse repetition frequency decoder 106 can identify the particular laser.

The example graphs show as follows.

The upconversion emissions graph and the corresponding imager output signal graph show the laser flash captured by the pixels of the silicon-based image sensor 102 and occurs before a frame read N of the silicon-based image sensor 102.

Next, the area A under the emission curve shows the photon signal at a first time of a first frame read N post laser flash capture. The corresponding imager output signal graph shows a first frame read N that occurred post/after the laser flash was captured by the upconversion layer of crystals 104.

Next, the area B under the emission curve is as follows. The pulse repetition frequency decoder 106 is configured to use an area under an emission curve that provides a photon signal for a second time period of one or more frame reads N+1 when electrons in crystals with a dopant in the upconversion layer are in a higher energy state than their ground energy state and are still in a process of decaying to a ground energy state. The corresponding imager output signal graph shows the one or more frame reads N+1 when electrons in crystals with a dopant in the upconversion layer are in a higher energy state than their ground energy state and are still in a process of decaying to a ground energy state. The emission decay time of the upconversion layer of crystals 104 may last a relatively large number of frames.

Many electrons are driven to the high energy state during a, for example, 15 nanosecond laser pulse. The time needed for electrons to drop to a ground state is much longer than 15 ns. When electrons drop to a ground state a fraction of the energy is seen as a photon emission at a shorter wavelength than laser excitation. For devices fabricated with the erbium doped crystals in the upconversion layer of crystals 104, depending on crystal density, the time for all or most electrons to return to a ground state is about 10,000 ns to 15,000 ns. The combination of the known frame rate of the silicon-based image sensor 102 which could be 100 frames per second and the effect of 10 ms electrons flowing to the ground state is used in this new system and method to accurately calculate PRF; and therefore, determine a laser's PRF code more accurately than possible by frame rate alone.

Next, the area C under the emission curve is as follows. The pulse repetition frequency decoder 106 is configured to use an area under an emission curve that provides a photon signal for a third time period of a third frame read N+2 when electrons in the crystals with the dopant in the upconversion layer are in a higher energy state but within this frame read the electrons have decayed to the ground energy state. The corresponding imager output signal graph shows the one or more frame reads N+2 when electrons in the crystals with the dopant in the upconversion layer are in a higher energy state but within this frame read the electrons have decayed to the ground energy state. Both the emission curve and corresponding imager output signal graph, after the N+2 reads, will be zero until after the next flash.

Thus, the pulse repetition frequency decoder 106 uses known emission decay time versus combined with frame rate to accurately determine when each laser pulse occurred. This approach determines the PRF Code. FIG. 7 shows a notional decay shape based on rough measurements of an example set of upconverting crystals. The ratio of measurements of the output signals recorded for curves A, B, and C provides the information needed to determine the time of the laser flash relative to frame read N. The ratio will vary for each laser pulse because the laser is out of sync with the camera frames. When this process is repeated for multiple sequential laser flashes, the PRF code can be determined for that laser. The pulse repetition frequency decoder 106 can use a frame rate to resolve, for example, the 10 ms time space between laser codes. The pulse repetition frequency decoder 106 can determine pulse frequency using circuits built into the Read-Out IC (ROIC). A counter circuit can be used to measure the time between laser flashes since the flashes provide well defined signals.

In an embodiment, the pulse repetition frequency decoder 106 cooperating with the silicon-based image sensor 102 and the upconversion layer of crystals 104 can provide a measurement of short-wave infrared (SWIR) laser pulse repetition frequency using SWIR upconversion with the upconversion layer of crystals 104. The pulse repetition frequency decoder 106 can identify covert SWIR laser using the silicon-based image sensor 102 with the upconverting coating which allows, for example, locating laser spots in the wavelength range of, for example, 1500 nm to 1550 nm. An erbium doped glass laser typically can have a wavelength of 1535 nm. The pulse repetition frequency decoder 106 cooperates with upconverting crystals and a low-cost silicon image sensor to spot, for example, SWIR lasers captured in a captured frame.

In an embodiment, the upconversion layer of crystals 104 can use an Erbium doped upconverting crystals to decrease the wavelength of a captured laser pulse of an example 1550 nm laser down to 980 nm and 1000 nm wavelengths based on allowed outer shell electron energy allowed in the crystal matrix. These upconverted wavelengths, such as 980 nm and 1000 nm, from the upconversion layer of crystals 104 can then be detected by the silicon-based image sensor 102. The pulse repetition frequency can fall in the range of, for example, 1 Hz to 3 Hz, with a time period between codes changing by 10 ms.

The pulse repetition frequency decoder 106 uses a combination of known imager frame rate and the decay time of electrons from the state of higher energy to a ground state resulting from incoming laser energy to measure PRF more accurately than possible for a single frame alone if the frame is not many times higher than 1/(code step time).

In some domains and situations, there can be many lasers in the camera's field of view (FOV). Each laser has a pulse repetition frequency code for identification. It is important to know the identity of the laser using a PRF code. The pulse repetition frequency decoder 106 can determine a laser's PRF code for all of the lasers in a scene limited by resolution and the number of pixels processed. In this way, all lasers in the scene can have their PRF decoded and identified. In an embodiment, at least four or more lasers can be simultaneously decoded in a scene. This process can be done for as many laser signals seen per frame. The limit is the number of imager pixels and processing/power allowed but can be at least four or more different lasers.

In an example, the pulse repetition frequency decoder 106 cooperating with the upconversion layer of crystals 104 may extend the wavelength responsivity of relatively lower cost silicon-based image sensor 102 such as CMOS, CCD, and the like, to sense 1550 nm light used as an eye safe laser light, light detection and ranging (LIDAR), laser designator light, or the like. In other words, the pulse repetition frequency decoder 106 cooperating with the upconversion layer of crystals 104 may provide a lower cost, silicon-based sensor configured to sense electromagnetic radiation wavelength ranges not otherwise detectable using a standard fabricated photo-sensitive silicon substrate.

Additionally, the pulse repetition frequency decoder 106 cooperating with the upconversion layer of crystals 104 may provide a negative electric charge configured to stabilize the back surface of a silicon substrate for a back side illuminated electron-based sensor. A positively charged upconverting layer could be used for hole-based sensors. The pulse repetition frequency decoder 106 cooperating with the upconversion layer of crystals 104 may provide a multi-functional layer configured to increase the NIR quantum efficiency and extend the wavelength range of silicon-based sensor, and provide stabilization of the back surface of a silicon substrate, which may provide for a lower cost visible and infrared sensor capable of sensing light in any of the UV/VIS/NIR/SWIR/MWIR/LWIR wavelength ranges.

The pulse repetition frequency decoder 106 measures PRF for a laser using an upconverting crystal and is different from the previous practice using materials such as InGaAs.

Again, the crystal emission signal can have a relatively long decay which can be >10 ms. A standard silicon imager has a specific frame rate and is read row by row. For a global shutter, it is not possible to know when a laser flash occurred in the frame when the laser flash is very short compared to a frame integration time. If the integration time is very short, then the laser flash may occur during the time when there is no charge integration in the detector upconversion layer of crystals 104. For a rolling shutter, the read out is scanned row by row through the frame time. The last row is read out nearly a frame later than the first row. The laser flash is not synchronized to the image sensor's frame rate. The system and method for the pulse repetition frequency decoder 106 herein addresses these issues to overcome to read laser PRF code.

The system and method of the pulse repetition frequency decoder 106 is based on a frame time and upconversion crystal emission decay time.

Figure 8:
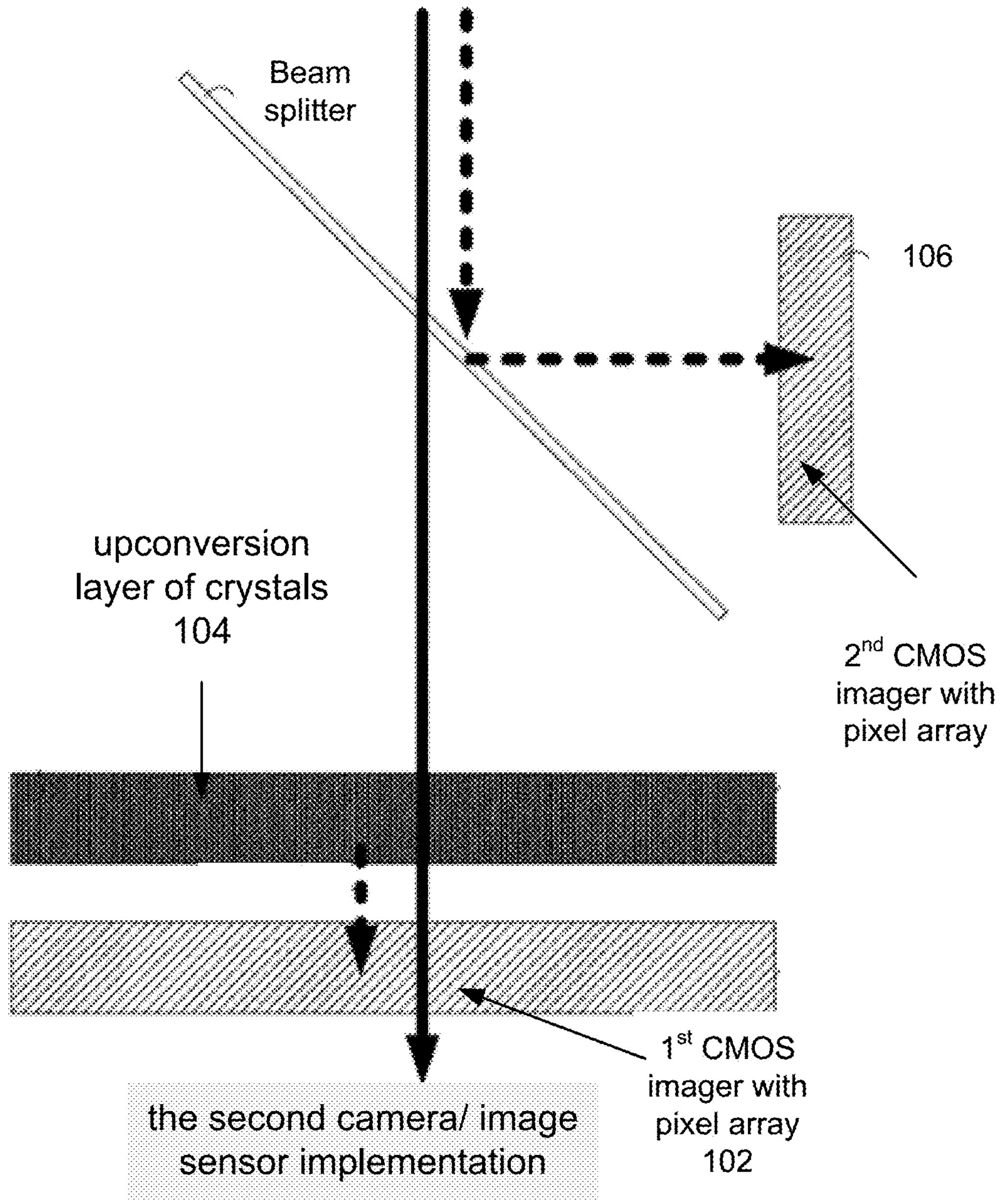
FIG. 8 illustrates a block diagram of an embodiment of an example silicon-based image sensor that has i) the pixel array with one or more pixels and ii) the upconversion layer of crystals, and the pulse repetition frequency decoder that are configured to cooperate with a second image sensor.

FIG. 8 illustrates a block diagram of an embodiment of an example silicon-based image sensor that has i) the pixel array with one or more pixels and ii) the upconversion layer of crystals, and the pulse repetition frequency decoder that are configured to cooperate with a second image sensor. The pixels in the second image sensor 105 are configured to receive light in all wavelengths of an image frame. The pixels in the first image sensor 102 are configured to receive light in all wavelengths of an image frame but cooperate with the upconversion layer of crystals 104. The light in all wavelengths of an image frame will be incident on the upconversion layer of crystals 104. Some of the light incident on the upconversion layer of crystals 104 in a first wavelength will be absorbed and converted by the upconversion layer of crystals 104 into a second wavelength, which is different than the first wavelength. The light in the second wavelength is transmitted to the one or more pixels in the silicon-based image sensor 102. Thus, the device has two image sensors 102 and 105 cooperating with each other. A first silicon-based image sensor 102 that has i) a pixel array with one or more pixels and ii) an upconversion layer of crystals 104. A second image sensor 106 that does not have an upconversion layer of crystals.

The second image sensor 105 that does not have an upconversion layer of crystals is picking up the captured image in its best possible image quality along with no upconversion layer of crystals 104 causing the quality of that light to be slightly attenuated. The upconversion layer of crystals 104 can interfere with the clarity and the resolution of the objects in the captured image a little bit because of i) being an obstruction to some of the wavelengths as well as ii) the emissions from this layer can interfere with the wavelengths of the objects naturally captured in that image frame.

The light beam splitter splits the incident light from the camera lens so that each image sensor 102 and 105 gets the same captured frame of incident light. The exact same image is being sent down to the first silicon-based image sensor 102 that has i) a pixel array with one or more pixels and ii) an upconversion layer of crystals 104 and the second image sensor 105 that does not have an upconversion layer of crystals 104. The first silicon-based image sensor 102 that has the upconversion layer of crystals 104 on it cooperates with the pulse repetition frequency decoder 106 to determine the pulse repetition frequency of any lasers captured in a frame. The electronics of the camera can then also superimpose the captured images by both of the image sensors 102 and 105 and when the electronic circuit stitches them back together, identify what objects are in the captured frame, and what laser is associated with the objects. The image of the unobstructed, uninterfered with, second image sensor 105 will be used to generate the image being seen by a user while the superimposed image from the pulse repetition frequency decoder 106 can add the identification of the laser for each object in the image using a laser.

The two silicon-based image sensors 102, 105 approach can be used to obtain the greatest capability of getting the longest range to detect laser pulses and the highest light condition sensitivity for up conversion and then put filters on it, so it will work for both day light conditions and night light conditions. The system merely needs to worry about aligning/stitching the captured image of a first silicon-based image sensor 102 to the other silicon-based image sensor 105.

However, in an embodiment using a single silicon-based image sensor 102, different levels of crystal and dopant fill within the upconversion layer of crystals 104, such as 60% fill, to use a single image sensor can also be used to achieve some satisfactory compromise between 1) distance range to detect laser pulses, 2) light condition sensitivity for up conversion and operation of the device, and 3) image quality of objects captured in the image.

The two silicon-based image sensors 102, 105 approach can use image sensor over a focal plane with an upconverting crystal layer and a separate image sensor with a second focal plane.

Computing Systems

Figure 9:
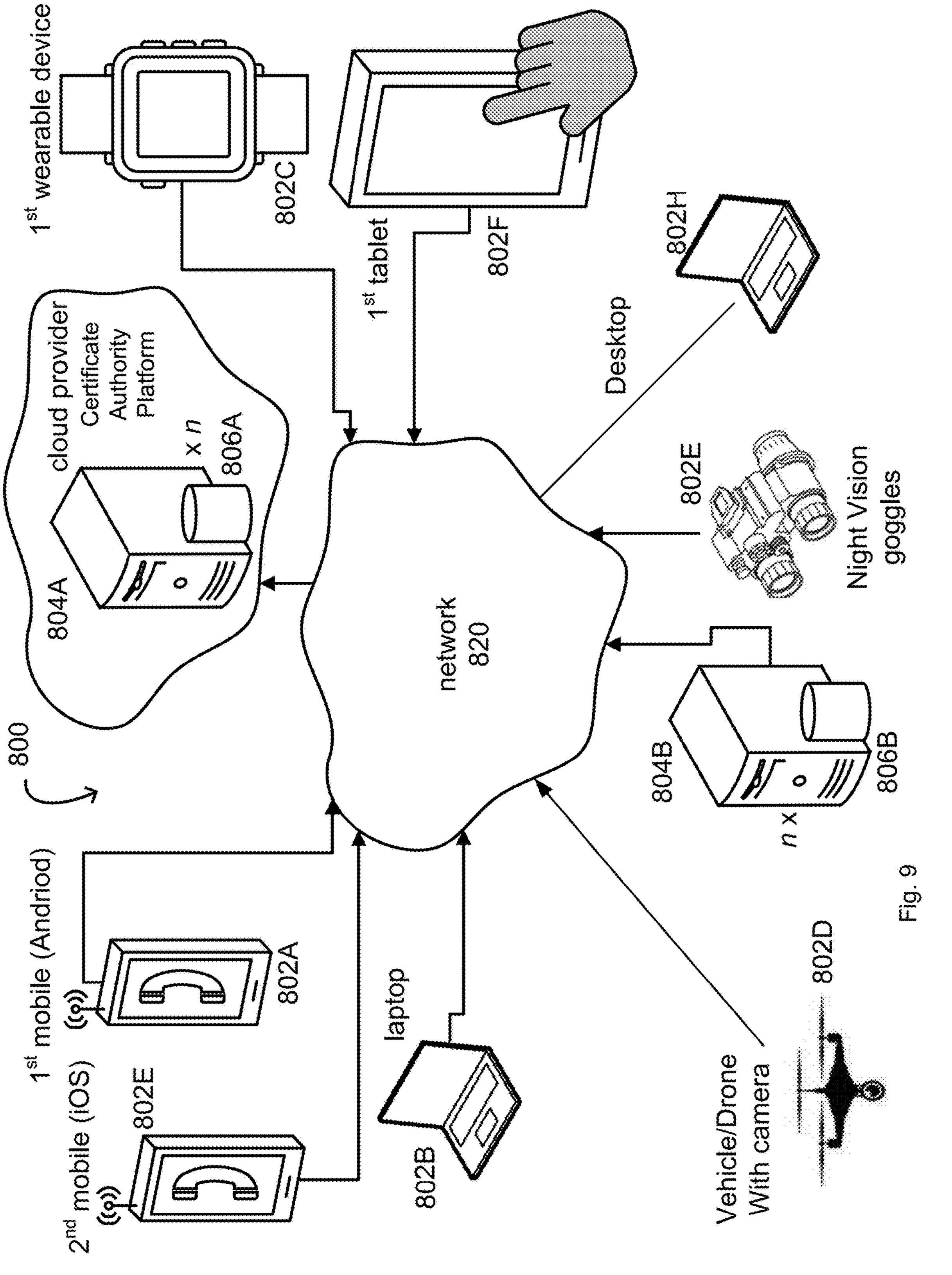
FIG. 9 illustrates a diagram of an embodiment of devices with the camera with the silicon-based image sensor that has i) a pixel array with one or more pixels, ii) an upconversion layer of crystals, and iii) a pulse repetition frequency decoder.

FIG. 9 illustrates a diagram of an embodiment of devices with the camera with the silicon-based image sensor that has i) a pixel array with one or more pixels, ii) an upconversion layer of crystals, and iii) a pulse repetition frequency decoder. The network environment 800 has a communications network 820 that connects server computing systems 804A through 804B, and at least one or more client computing systems 802A to 802H. As shown, there may be many server computing systems 804A through 804B and many client computing systems 802A to 802H connect to each other via the network 820, which may be, for example, the Internet. The cloud-based server 804A can be coupled to two or more client computing systems such as a vehicle/drone 802D using the camera with the silicon-based image sensor 102, the upconversion layer of crystals 104, and the pulse repetition frequency decoder 106 as well as the night vision goggles 802E using the camera with the silicon-based image sensor 102, the upconversion layer of crystals 104, and the pulse repetition frequency decoder 106. Note, that alternatively the network 820 might be or include one or more of: an optical network, a cellular network, the Internet, a Local Area Network (LAN), Wide Area Network (WAN), satellite link, fiber network, cable network, or a combination of these and/or others.

Figure 10:
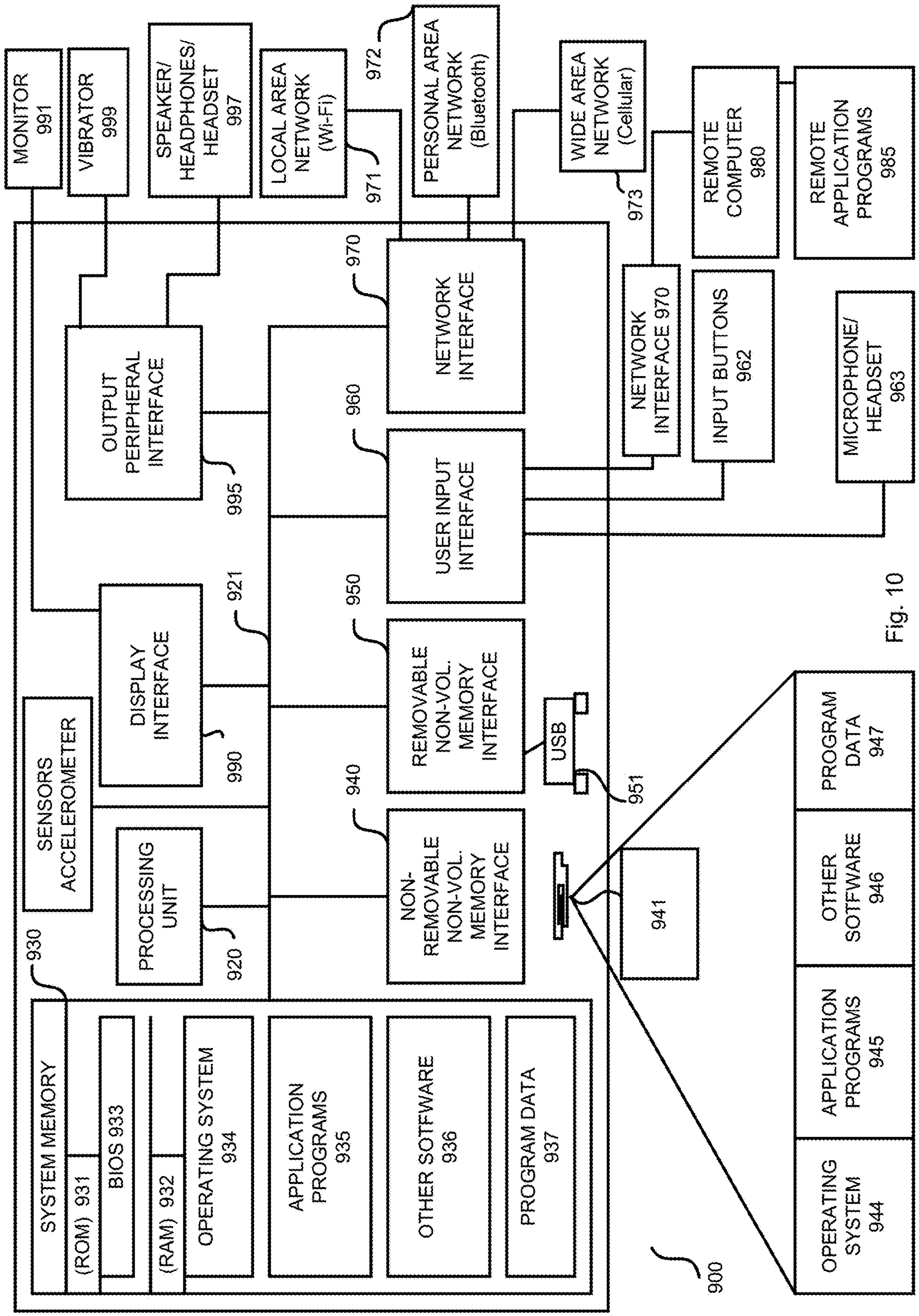
FIG. 10 illustrates a diagram of an embodiment of a computing device that can be a part of the systems associated with the silicon-based image sensor, the upconversion layer of crystals, the pulse repetition frequency decoder, and other associated modules discussed herein.

FIG. 10 illustrates a diagram of an embodiment of a computing device that can be a part of the systems associated with the silicon-based image sensor 102, the upconversion layer of crystals 104, the pulse repetition frequency decoder 106, and other associated modules discussed herein. The computing device 900 may include one or more processors or processing units 920 to execute instructions, one or more memories 930-932 to store information, one or more data input components 960-963 to receive data input from a user of the computing device 900, one or more modules that include the management module, a network interface communication circuit 970 to establish a communication link to communicate with other computing devices external to the computing device, one or more sensors where an output from the sensors is used for sensing a specific triggering condition and then correspondingly generating one or more preprogrammed actions, a display screen 991 to display at least some of the information stored in the one or more memories 930-932 and other components. Note, portions of this system that are implemented in software 944, 945, 946 may be stored in the one or more memories 930-932 and are executed by the one or more processors 920.

As discussed, portions of the silicon-based image sensor 102, the upconversion layer of crystals 104, the pulse repetition frequency decoder 106 can be implemented with aspects of the computing device.

The system memory 930 includes computer storage media in the form of volatile and/or nonvolatile memory such as read-only memory (ROM) 931 and random access memory (RAM) 932. These computing machine-readable media can be any available media that can be accessed by computing system 900. By way of example, and not limitation, computing machine-readable media use includes storage of information, such as computer-readable instructions, data structures, other executable software, or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media.

The system further includes a basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, the RAM 932 can include a portion of the operating system 934, application programs 935, other executable software 936, and program data 937.

The computing system 900 can also include other removable/non-removable volatile/nonvolatile computer storage media. By way of example only, the system has a solid-state memory 941. The solid-state memory 941 is typically connected to the system bus 921 through a non-removable memory interface such as interface 940, and USB drive 951 is typically connected to the system bus 921 by a removable memory interface, such as interface 950.

A user may enter commands and information into the computing system 900 through input devices such as a keyboard, touchscreen, or software or hardware input buttons 962, a microphone 963, a pointing device and/or scrolling input component, such as a mouse, trackball or touch pad. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a mobile computing device, a server, a router, a network PC, a peer device or other common network node, and typically includes many or all of the elements described above relative to the computing system 900. The logical connections can include a personal area network (PAN) 972 (e.g., Bluetooth®), a local area network (LAN) 971 (e.g., Wi-Fi), and a wide area network (WAN) 973 (e.g., cellular network), but may also include other networks such as a personal area network (e.g., Bluetooth®). Such networking environments are commonplace in offices, enterprise-wide computer networks, intranets and the Internet. A browser application may be resonant on the computing device and stored in the memory.

When used in a LAN networking environment, the computing system 900 is connected to the LAN 971 through a network interface 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, the system has remote application programs 985 as residing on remote computing device 980. It will be appreciated that the network connections shown are examples and other means of establishing a communications link between the computing devices that may be used.

In some embodiments, software used to facilitate algorithms discussed herein can be embedded onto a non-transitory machine-readable medium. A machine-readable medium includes any mechanism that stores information in a form readable by a machine (e.g., a computer). For example, a non-transitory machine-readable medium can include read-only memory (ROM); random access memory (RAM); magnetic disk storage media; optical storage media; flash memory devices; Digital Versatile Disc (DVD's), EPROMS, EEPROMs, FLASH memory, magnetic or optical cards, or any type of media suitable for storing electronic instructions.

Note, an application described herein includes but is not limited to software applications, mobile applications, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, HTTP, Java, Python, or other similar languages. Also, an algorithm can be implemented with lines of code in software, configured logic gates in software, or a combination of both. Any portions of an algorithm implemented in software can be stored in an executable format in portion of a memory and is executed by one or more processors. In an embodiment, a module can be implemented with electronic circuits, software being stored in a memory and executed by one or more processors, and any combination of both.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

References in the specification to "an embodiment," "an example," etc., indicate that the embodiment or example described may include a particular feature, structure, or characteristic, but every embodiment may not necessarily include the particular feature, structure, or characteristic. Such phrases can be not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

The invention claimed is:

1. An apparatus, comprising:

a first silicon-based image sensor with an upconversion layer of crystals configured to receive light from a common beam splitter with a second image sensor in a first range of wavelengths onto the second image sensor, an optical band pass filter configured to pass some of the light to be incident on the upconversion layer of crystals of the first silicon-based image sensor in a second range of wavelengths, which will be absorbed and converted by the upconversion layer of crystals into a third range of wavelengths, and then the light in the third range of wavelengths is transmitted onto the first silicon-based image sensor, and a pulse repetition frequency decoder configured to decode a pulse repetition frequency of a laser flash in the second range of wavelengths passed by the optical band pass filter and subsequently upconverted by the upconversion layer of crystals into the third range of wavelengths and then captured by the first silicon-based image sensor.

2. The apparatus of claim 1, further comprising:

an image processing unit that has one or more processors, software stored in a memory, and at least two separate channels, where a gain adjustment for a first channel for image data collected from the first silicon-based image sensor is set higher compared to a second channel for image data collected from the second image sensor.

3. The apparatus of claim 1, wherein second range of wavelengths includes one or more of ultraviolet (UV) light, visible light, and near-infrared (NIR) light.

4. The apparatus of claim 1, wherein the upconversion layer in the first silicon-based image sensor has a heavy coating of a plurality of crystals intermixed with a dopant that is configured to convert short wave infrared (SWIR) light in the second range of wavelengths passed by the optical band pass filter into light wavelengths of visible light to near infrared light in the third range of wavelengths.

5. The apparatus of claim 1, further comprising:

a refractive lens having an index of refraction such that wavelengths i) in the first range of wavelengths of visible and near infrared light and ii) in the second range of wavelengths of short wave infrared wavelengths do not focus to a same focal distance.

6. The apparatus of claim 1, where the first silicon-based image sensor and the second image sensor are configured to have different amounts of pixels, and where the first silicon-based image sensor is configured to operate at a higher frame rate than the second image sensor.

7. The apparatus of claim 1, further comprising:

a lens with a refractive index that has a different focus distance for the first silicon-based image sensor and the second image sensor due to refractive index change with the first and second range of wavelengths, where a first focal distance for the second image sensor is configured to receive light in an image frame from the common beam splitter in the first range of wavelengths of 400 nanometers to 1050 nanometers, and where a second focal distance for the first silicon-based image sensor is configured to receive light in the image frame from the common beam splitter in the second range of wavelengths of 1525 nanometers to 1575 nanometers.

8. An apparatus, comprising:

a first silicon-based image sensor that has an upconversion layer of crystals on the first silicon-based image sensor configured to receive light from a common beam splitter with a second image sensor, wherein the second image sensor are configured to receive light from the common beam splitter in a first range of wavelengths, a dichromatic coating on the common beam splitter configured to pass some of the light in to be incident on the upconversion layer of crystals in a second range of wavelengths, which will be absorbed and converted by the upconversion layer of crystals into a third range of wavelengths and then transmitted to pixels in the first silicon-based image sensor, and a pulse repetition frequency decoder configured to cooperate with the upconversion layer of crystals to decode a pulse repetition frequency of a laser flash in the second range of wavelengths passed by the dichromatic coating on the common beam splitter and subsequently upconverted and then captured by one or more pixels of the first silicon-based image sensor.

9. The apparatus of claim 8, wherein the upconversion layer is configured to cooperate with the dichromatic coating on the common beam splitter to filter out wavelengths outside of the second range of wavelengths from being detected by one or more pixels in the first silicon-based image sensor, and wherein the second range of wavelengths is short wave infrared light.

10. The apparatus of claim 8, wherein the dichromatic coating on the common beam splitter is configured to make the common beam splitter into a wavelength cutoff filter and merely pass light in the second range of wavelengths of equal to or greater than 1500 nanometers to be incident on the upconversion layer of crystals in the first silicon-based image sensor.

11. A method to decode a pulse repetition frequency of a laser flash, comprising:

providing a first silicon-based image sensor with an upconversion layer of crystals on the first silicon-based image sensor to receive light from a common beam splitter with a second image sensor, wherein the second image sensor is configured to receive light from the common beam splitter in a first range of wavelengths, providing an optical band pass filter to pass some of the light to be incident on the upconversion layer of crystals in a second range of wavelengths, which will be absorbed and converted by the upconversion layer of crystals into a third range of wavelengths and then transmitted onto pixels in the first silicon-based image sensor, and providing a pulse repetition frequency decoder to cooperate with the upconversion layer of crystals to decode the pulse repetition frequency of the laser flash in the second range of wavelengths passed by the optical band pass filter and subsequently upconverted by the upconversion layer of crystals into the third range of wavelengths and then captured by one or more pixels of the first silicon-based image sensor.

12. The method of claim 11, further comprising:

providing a gain adjustment for a first channel for image data collected from the first silicon-based image sensor to be set higher compared to a second channel for image data collected from the second image sensor.

13. The method of claim 11, further comprising:

providing a pixel array with one or more pixels on the second image sensor to detect light wavelengths in the second range of wavelengths, which includes one or more of ultraviolet (UV) light, visible light, and near-infrared (NIR) light.

14. The method of claim 11, further comprising:

providing the upconversion layer in the first silicon-based image sensor to have a heavy coating of a plurality of crystals intermixed with a dopant that is configured to convert short wave infrared (SWIR) light in the second range of wavelengths passed by the optical band pass filter into light wavelengths of visible light to near infrared light in the third range of wavelengths.

15. The method of claim 11, further comprising:

providing a refractive lens with an index of refraction such that wavelengths i) in the first range of wavelengths of visible and near infrared light and ii) in the second range of wavelengths of short wave infrared wavelengths do not focus to a same focal distance.

16. The method of claim 11, further comprising:

providing i) the first silicon-based image sensor and the second image sensor to have different amounts of pixels and ii) the first silicon-based image sensor to operate at a higher frame rate than the second image sensor.

17. The method of claim 11, further comprising:

providing a lens with a refractive index that has a different focus distance for the first silicon-based image sensor and the second image sensor due to refractive index change with the first and second range of wavelengths, providing a first focal distance for the second image sensor to receive light in an image frame from the common beam splitter in the first range of wavelengths of 400 nanometers to 1050 nanometers, and providing a second focal distance for the first silicon-based image sensor to receive light in the image frame from the common beam splitter in the second range of wavelengths of 1525 nanometers to 1575 nanometers.

18. A method to decode a pulse repetition frequency of a laser flash, comprising:

providing a first silicon-based image sensor with an upconversion layer of crystals to receive light from a common beam splitter with a second image sensor, wherein pixels in the second image sensor are configured to receive light in an image frame from the common beam splitter in a first range of wavelengths, providing a dichromatic coating on the common beam splitter to pass some of the light to be incident on the upconversion layer of crystals in a second range of wavelengths, which will be absorbed and converted by the upconversion layer of crystals into a third range of wavelengths and then transmitted to one or more pixels in the first silicon-based image sensor, and providing a pulse repetition frequency decoder to cooperate with the upconversion layer of crystals to decode a pulse repetition frequency of a laser flash in the second range of wavelengths passed by the dichromatic coating on the common beam splitter and subsequently upconverted by the upconversion layer of crystals into the third range of wavelengths and then captured by one or more pixels of the first silicon-based image sensor.

19. The method of claim 18, further comprising:

providing the upconversion layer to cooperate with the dichromatic coating on the common beam splitter to filter out wavelengths outside of the second range of wavelengths from being detected by the one or more pixels in the first silicon-based image sensor, wherein the second range of wavelengths is short wave infrared light.

20. The method of claim 18, further comprising:

providing the dichromatic coating on the common beam splitter to make the common beam splitter into a wavelength cutoff filter and merely pass light in the second range of wavelengths of equal to or greater than 1500 nanometers to be incident on the upconversion layer of crystals in the first silicon-based image sensor.

* * * * *